(12) United States Patent
Koizumi et al.

(10) Patent No.: US 8,754,429 B2
(45) Date of Patent: Jun. 17, 2014

(54) OPTICAL SEMICONDUCTOR DEVICE AND METHOD FOR MANUFACTURING SAME

(75) Inventors: Hiroshi Koizumi, Kanagawa-ken (JP);
Yasuhide Okada, Kanagawa-ken (JP);
Susumu Obata, Kanagawa-ken (JP);
Tomomichi Naka, Kanagawa-ken (JP);
Kazuhito Higuchi, Kanagawa-ken (JP);
Kazuo Shimokawa, Kanagawa-ken (JP);
Yoshiaki Sugizaki, Kanagawa-ken (JP);
Akihiro Kojima, Ishikawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/154,999

(22) Filed: Jun. 7, 2011

(65) Prior Publication Data

US 2011/0297987 A1 Dec. 8, 2011

(30) Foreign Application Priority Data

Jun. 7, 2010 (JP) ................................ 2010-130526

(51) Int. Cl.
*H01L 33/00* (2010.01)
*H01L 21/00* (2006.01)

(52) U.S. Cl.
USPC ................... 257/98; 438/29; 257/E33.061

(58) Field of Classification Search
USPC .............. 257/91, 98, E21.599, E21.305, 257/E21.602, E21.6, E33.056, E33.061, 257/E33.062; 438/26–29, 106, 113, 114, 46
See application file for complete search history.

(56) References Cited

U.S. PATENT DOCUMENTS

| 2002/0024053 A1* | 2/2002 | Inoue et al. | 257/79 |
| 2004/0227148 A1* | 11/2004 | Camras et al. | 257/99 |
| 2006/0151802 A1* | 7/2006 | Tsuchiya et al. | 257/99 |
| 2006/0160257 A1* | 7/2006 | Wu et al. | 438/22 |
| 2006/0202223 A1* | 9/2006 | Sackrison et al. | 257/99 |

(Continued)

FOREIGN PATENT DOCUMENTS

| JP | 11-150295 | 6/1999 |
| JP | 2000-183407 | 6/2000 |

(Continued)

OTHER PUBLICATIONS

Office Action issued Aug. 18, 2011, in Japanese Patent Application No. 2010-130526 (with English=language translation).

(Continued)

*Primary Examiner* — Daniel Luke
*Assistant Examiner* — Latanya N Crawford
(74) *Attorney, Agent, or Firm* — Oblon, Spivak, McClelland, Maier & Neustadt, L.L.P.

(57) ABSTRACT

According to one embodiment, an optical semiconductor device includes a light emitting layer, a transparent layer, a first metal post, a second metal post and a sealing layer. The light emitting layer includes a first and a second major surface, a first and a second electrode. The second major surface is a surface opposite to the first major surface, and the first electrode and second electrodes are formed on the second major surface. The transparent layer is provided on the first major surface. The first metal post is provided on the first electrode. The second metal post is provided on the second electrode. The sealing layer is provided on the second major surface. The sealing layer covers a side surface of the light emitting layer and seals the first and second metal posts while leaving end portions of the first and second metal posts exposed.

38 Claims, 20 Drawing Sheets

(56) References Cited

U.S. PATENT DOCUMENTS

| | | | |
|---|---|---|---|
| 2006/0261358 A1* | 11/2006 | Hwang et al. | 257/91 |
| 2007/0034995 A1* | 2/2007 | Kameyama et al. | 257/666 |
| 2008/0179611 A1 | 7/2008 | Chitnis et al. | |
| 2010/0006864 A1* | 1/2010 | Steigerwald | 257/88 |
| 2010/0051995 A1* | 3/2010 | Katsuno et al. | 257/98 |
| 2010/0112734 A1 | 5/2010 | Koizumi et al. | |
| 2010/0140640 A1* | 6/2010 | Shimokawa et al. | 257/98 |
| 2011/0073889 A1* | 3/2011 | Sugizaki et al. | 257/98 |
| 2011/0204400 A1 | 8/2011 | Koizumi et al. | |
| 2011/0229993 A1* | 9/2011 | Hsieh | 438/29 |
| 2011/0233585 A1* | 9/2011 | Kojima et al. | 257/98 |
| 2011/0266560 A1* | 11/2011 | Yao et al. | 257/88 |
| 2011/0297983 A1 | 12/2011 | Nishiuchi et al. | |

FOREIGN PATENT DOCUMENTS

| | | |
|---|---|---|
| JP | 2002-64112 A | 2/2002 |
| JP | 2002-141559 | 5/2002 |
| JP | 2002-305328 | 10/2002 |
| JP | 2003-7929 | 1/2003 |
| JP | 2005-209852 | 8/2005 |
| JP | 2006-303430 | 11/2006 |
| JP | 2007-123311 | 5/2007 |
| JP | 2008-205468 | 9/2008 |
| JP | 2010-87283 | 4/2010 |
| JP | 2010-114218 | 5/2010 |
| JP | 2010-517289 | 5/2010 |
| JP | 2010-135763 | 6/2010 |
| JP | 2011-171557 | 9/2011 |
| TW | 544826 | 8/2003 |
| WO | WO 2007/136065 A1 | 11/2007 |
| WO | WO 2008/062783 A1 | 5/2008 |

OTHER PUBLICATIONS

U.S. Appl. No. 13/419,684, filed Mar. 14, 2012, Koizumi, et al.
Office Action issued Apr. 19, 2011, in Japanese Patent Application No. 2010-130526, filed Jun. 7, 2010 (with English-Language Translation).
U.S. Appl. No. 13/456,458, filed Apr. 26, 2012, Uekita, et al.
Office Action issued May 17, 2013, in Japanese Patent Application No. 2011-228364 with English translation.
Office Action issued on Jun. 5, 2013 in Chinese Patent Application No. 201110207833.1 (with English-language translation).
Office Action issued in Taiwanese Patent Application No. 100119867 on Sep. 30, 2013 with partial English translation.

* cited by examiner

OPTICAL SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No.2010-130526, filed on Jun. 7, 2010; the entire contents of which are incorporated herein by reference.

FIELD

Embodiments described herein relate generally to an optical semiconductor device and a method for manufacturing the same.

BACKGROUND

Various semiconductor light emitting elements that emit not only in the visible light band of red, green, blue, etc., but also in the wide wavelength band from infrared light to ultraviolet light are being utilized as small and low power-consumption light emitting elements. Optical semiconductor devices also have been developed to emit white light by a combination of a fluorescer and a semiconductor light emitting element such as, for example, a blue LED (Light Emitting Diode).

The most versatile optical semiconductor device currently used as a product is a semiconductor light emitting element in which a semiconductor layer is epitaxially grown on a substrate. In other words, the individual semiconductor light emitting elements are obtained by epitaxially growing the semiconductor layer on a substrate such as GaAs, GaP, sapphire, etc., forming electrodes and the like, and subsequently subdividing. Then, the optical semiconductor devices are completed by mounting the semiconductor light emitting elements thus obtained onto leadframes, SMD (Surface Mounting Device)-type housings, various mounting substrates, etc., performing the prescribed interconnects, and sealing the semiconductor light emitting elements with a transparent resin.

DETAILED DESCRIPTION

Figure 1A:
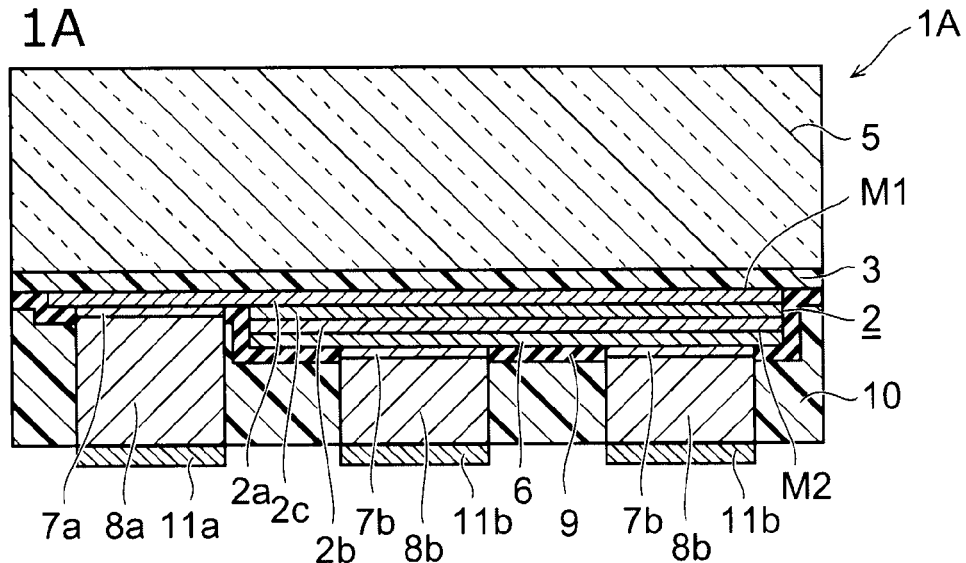
FIG. 1A is a cross-sectional view illustrating the schematic configuration of an optical semiconductor device according to the embodiment.

In general, according to one embodiment, an optical semiconductor device includes a light emitting layer, a transparent layer, a first metal post, a second metal post and a sealing layer. The light emitting layer includes a first major surface, a second major surface, a first electrode, and a second electrode. The second major surface is a surface opposite to the first major surface, and the first electrode and the second electrode are formed on the second major surface. The transparent layer is provided on the first major surface, and the transparent layer is transparent. The first metal post is provided on the first electrode. The second metal post is provided on the second electrode. The sealing layer is provided on the second major surface. The sealing layer is configured to cover a side surface of the light emitting layer and seal the first metal post and the second metal post while leaving an end portion of the first metal post and an end portion of the second metal post exposed.

In general, according to another embodiment, an optical semiconductor device includes a light emitting layer, a fluorescent layer, a first metal post, a second metal post, and a sealing layer. The light emitting layer includes a first major surface, a second major surface, a first electrode, and a second electrode. The second major surface is a surface opposite to the first major surface. The first electrode and the second electrode are formed on the second major surface. The fluorescent layer is provided on the first major surface. The fluorescent layer includes a fluorescer configured to absorb light emitted from the light emitting layer and emit light of a different wavelength. The first metal post is provided on the first electrode. The second metal post is provided on the second electrode. The sealing layer is provided on the second major surface. The sealing layer is configured to cover a side surface of the light emitting layer and seal the first metal post and the second metal post while leaving an end portion of the first metal post and an end portion of the second metal post exposed.

In general, according to one embodiment, an optical semiconductor device includes a light emitting layer, a fluorescent layer, a first metal post, a second metal post and a sealing layer. The light emitting layer includes a first major surface, a second major surface, a first electrode, and a second electrode. The second major surface is a surface opposite to the first major surface, and the first electrode and the second electrode are formed on the second major surface. The fluorescent layer is provided on the first major surface, and the fluorescent layer includes a fluorescer configured to absorb light emitted from the light emitting layer and emit light of a different wavelength. The first metal post is provided on the first electrode. The second metal post is provided on the second electrode. The sealing layer is provided on the second major surface, and the sealing layer is configured to cover a side surface of the light emitting layer and seal the first metal post and the second metal post while leaving an end portion of the first metal post and an end portion of the second metal post exposed.

In general, according to one embodiment, a method is disclosed for manufacturing an optical semiconductor device. The method can include forming a light emitting layer by forming a plurality of sets of a positive electrode and a negative electrode on a first major surface side of a semiconductor stacked body including a plurality of semiconductor layers. The semiconductor stacked body is separated from a substrate after being epitaxially grown on the substrate. The method can include forming a transparent layer on a second major surface side of the light emitting layer opposite to the first major surface. The transparent layer is transparent to light emitted from the light emitting layer. In addition, the method can include performing singulation for each of the sets of the positive electrode and the negative electrode.

Various embodiments will be hereinafter described with reference to the accompanying drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

A first embodiment will now be described with reference to FIGS. 1A and 1B.

FIG. 1A is a cross-sectional view illustrating the schematic configuration of an optical semiconductor device according to the embodiment. FIG. 1B is a plan view illustrating a lower surface of the optical semiconductor device illustrated in FIG. 1A.

Figure 1B:
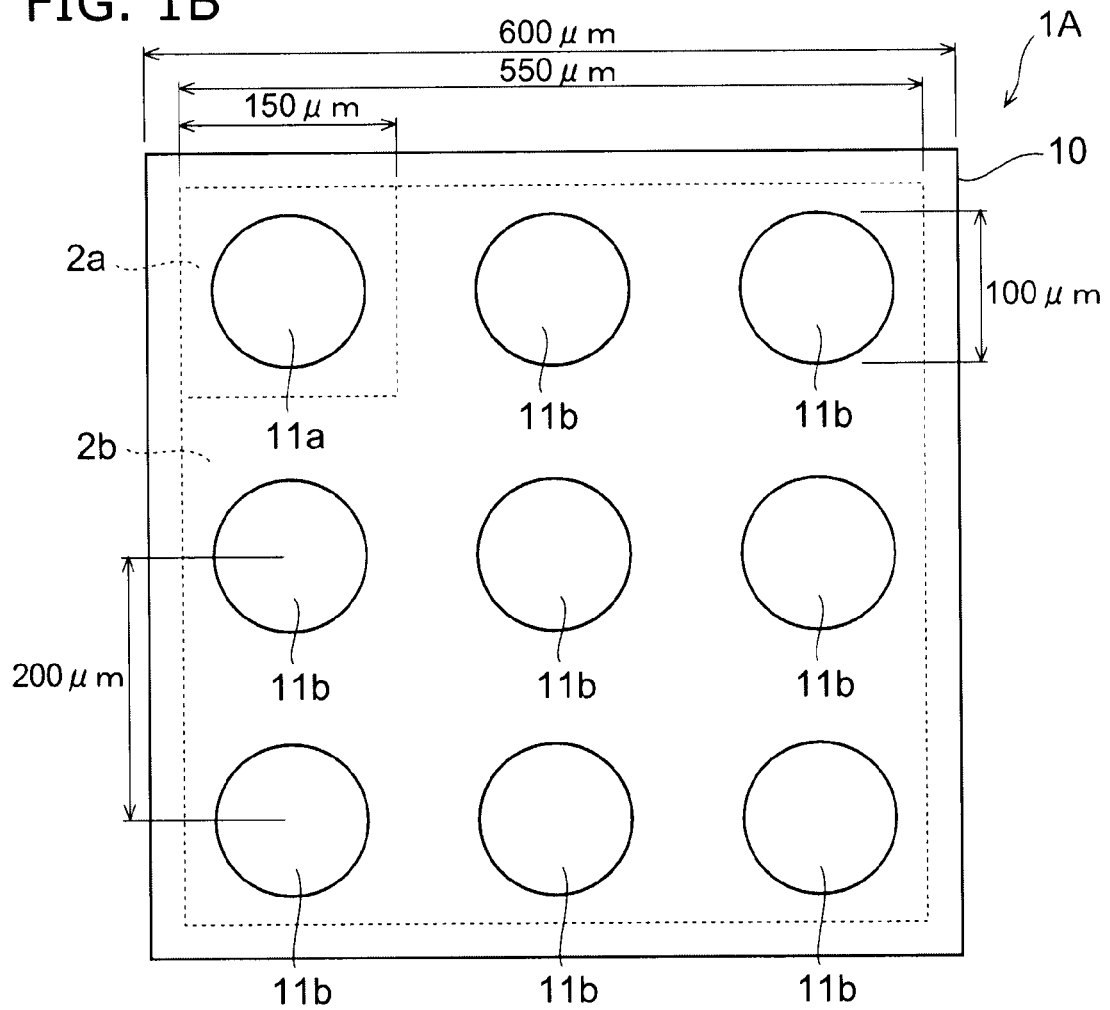
FIG. 1B is a plan view illustrating a lower surface of the optical semiconductor device illustrated in FIG. 1A.

The optical semiconductor device 1A according to the embodiment as illustrated in FIGS. 1A and 1B includes a light emitting layer 2 having a first major surface M1 and a second major surface M2, a bonding layer 3 provided on the first major surface M1, a transparent layer 5 provided on the bonding layer 3, a reflective layer 6 provided in a first region of the second major surface M2 of the light emitting layer 2, a first electrode 7a provided in a second region of the second major surface M2, multiple second electrodes 7b provided on the reflective layer 6, a first metal post 8a provided on the first electrode 7a, multiple second metal posts 8b provided on the second electrodes 7b, an insulating layer 9 provided on the second major surface M2 of the light emitting layer 2 while avoiding each of the metal posts 8a and 8b, a sealing layer 10 provided on the insulating layer 9 to seal each of the metal posts 8a and 8b, a first metal layer 11a provided on the end portion of the first metal post 8a, and multiple second metal layers 11b provided on the end portions of the second metal posts 8b.

The light emitting layer 2 includes a semiconductor stacked body including a first semiconductor layer 2a, a second semiconductor layer 2b having a surface area less than that of the first semiconductor layer 2a, and an active layer 2c clamped between the first semiconductor layer 2a and the second semiconductor layer 2b. The first semiconductor layer 2a is, for example, a first cladding layer which is an n-type semiconductor layer. The second semiconductor layer 2b is, for example, a second cladding layer which is a p-type semiconductor layer. However, the conductivity types of these layers are arbitrary. That is, the first semiconductor layer 2a may be the p type and the second semiconductor layer 2b may be the n type.

The first semiconductor layer 2a, the second semiconductor layer 2b, and the active layer 2c may include various compound semiconductors such as an InGaAlAs-based compound semiconductor, an InGaAlP-based compound semiconductor, and an InGaAlN-based compound semiconductor, etc.

For example, infrared light or a red light emission can be obtained by using GaAlAs as the material of the active layer 2c. A light emission of orange, yellow, green, etc., can be obtained by using InGaAlP as the material of the active layer 2c. A green or blue light emission or ultraviolet light can be obtained by using an InGaAlN-based compound semiconductor as the material of the active layer 2c.

Each of the first semiconductor layer 2a, the second semiconductor layer 2b, and the active layer 2c is not limited to being a single layer. For example, the active layer 2c may have a multilayered structure in which a quantum well layer and a barrier layer are combined. Similarly, the first semiconductor layer 2a and the second semiconductor layer 2b also may have multilayered structures in which multiple semiconductor layers are combined.

In the case where an InGaAlN-based compound semiconductor is used, the first semiconductor layer 2a is, for example, an n-type cladding layer including GaN. The second semiconductor layer 2b is, for example, a p-type cladding layer including GaN. The active layer 2c includes, for example, a quantum well layer made of InGaN and a barrier layer made of AlGaN stacked with the quantum well layer. Thus, the active layer 2c may have, for example, a single quantum well structure or a multiple quantum well structure.

The light emitting layer 2 is formed by, for example, sequentially depositing a crystal used to form the first semiconductor layer 2a, a crystal used to form the active layer 2c, and a crystal used to form the second semiconductor layer 2b on a not-illustrated substrate such as GaAs, GaP, sapphire, etc., and by subsequently removing the active layer 2c and the second semiconductor layer 2b in a prescribed region. The not-illustrated substrate also is removed from the light emitting layer 2. The thickness of the light emitting layer 2 is, for example, about 5 micrometers.

The first major surface M1 is the upper surface (in FIGS. 1A and 1B) of the first semiconductor layer 2a. The second major surface M2 is the lower surface (in FIGS. 1A and 1B) of the first semiconductor layer 2a and the lower surface (in FIGS. 1A and 1B) of the second semiconductor layer 2b; and there is a difference in levels therebetween. That is, the semiconductor stacked body, which includes the first semiconductor layer 2a, the second semiconductor layer 2b, and the active layer 2c, has the first major surface M1 and the second major surface M2 on the side opposite to the first major surface M1. The first electrode 7a and the second electrode 7b are provided on the second major surface M2 side of the semiconductor stacked body.

As illustrated in FIG. 1B, the planar configuration of the first semiconductor layer 2a is, for example, a square having sides of 550 micrometers (referring to the dotted line of FIG. 1B). The second semiconductor layer 2b is formed on the lower surface (in FIGS. 1A and 1B) of the first semiconductor layer 2a in a region excluding a corner region (a square having sides of 150 micrometers) of the first semiconductor layer 2a with the active layer 2c interposed. The active layer 2c has the same configuration as the second semiconductor layer 2b and has about the same surface area.

The bonding layer 3 is formed of, for example, a silicone resin. The thickness of the bonding layer 3 is, for example, not more than 1 micrometer. The bonding layer 3 bonds the first major surface M1 of the first semiconductor layer 2a of the light emitting layer 2 to the transparent layer 5. The silicone resin is, for example, methyl phenyl silicone having a refractive index of about 1.5. Other than methyl phenyl silicone, the resin included in the bonding layer 3 may be a silicone resin having another composition such as dimethyl silicone. The silicone resin is advantageous in the case where the emitted light from the light emitting layer 2 has a wavelength of blue or ultraviolet because the silicone resin has a high durability to blue and ultraviolet.

On the other hand, a resin appropriate for the application such as an epoxy resin, a hybrid resin of an epoxy resin and a silicone resin, a urethane resin, etc., may be used as the material of the bonding layer 3 in the case where the luminance of the light emitted from the light emitting layer 2 is low or degradation due to blue light does not occur.

The transparent layer 5 is transparent to the light emitted from the light emitting layer 2. The transparent layer 5 may be formed of an inorganic material or an organic material. Inorganic materials, for example, may include various oxides such as glass, quartz, aluminum oxide, etc., various nitrides such as silicon nitride, etc., various fluorides such as magnesium fluoride, etc. Organic materials may include, for example, acryl, epoxy, polycarbonate, polypropylene, polyethylene, silicone resin, etc.

The thickness of the transparent layer 5 may be, for example, about 200 micrometers. The material of the transparent layer 5 is not limited to a transparent material; and it is sufficient to transmit the light emitted from the light emitting layer 2. In other words, it is sufficient for the material of the transparent layer 5 not to completely absorb or reflect the light emitted from the light emitting layer 2.

By providing the transparent layer 5, the light extraction efficiency can be increased because the difference between the refractive index of the first semiconductor layer 2a and the refractive index of air can be reduced. In other words, the total internal reflection of the light emitted from the light emitting layer 2 at the light extraction surface of the light emitting layer 2 can be suppressed by providing the transparent layer 5 with a refractive index between the refractive index of the first semiconductor layer 2a and the refractive index of air. As a result, the extraction efficiency of the light emitted from the light emitting layer 2 to the outside (into the air) can be increased.

From this aspect, it is desirable for the transparent layer 5 to be formed of a transparent material having a refractive index in the range of 1 to 2.

As described below in detail using specific examples, the transparent layer 5 may have an effect of changing the propagation direction of the light such as, for example, a lens effect and/or a refraction effect. Thereby, the irradiation angle of the light emitted from the light emitting layer 2 can be adjusted.

The reflective layer 6 is formed of a metal such as Ag, Al, etc. The thickness of the reflective layer 6 is, for example, 0.3 micrometers. The reflective layer 6 is provided in the entire region (the first region) of the lower surface (in FIGS. 1A and 1B) of the second semiconductor layer 2b of the light emitting layer 2. In particular, a contact electrode (not illustrated) of Ni/Au is formed of metals such as Ni/Au having thicknesses of 0.1 micrometers/0.1 micrometers on the lower surface of the second semiconductor layer 2b; and the reflective layer 6 is formed thereon with a thickness of 0.3 micrometers.

The first electrode 7a is formed of, for example, metals such as Ni/Au having thicknesses of 0.1 micrometers/0.1 micrometers. The thickness of the first electrode 7a is, for example, 0.2 micrometers. The first electrode 7a is provided, for example, in a circular configuration having a diameter of 100 micrometers on an exposed region (the second region) of the lower surface (FIG. 1A) of the first semiconductor layer 2a of the light emitting layer 2 (referring to FIG. 1B).

Each of the second electrodes 7b also is formed of, for example, metals such as Ni/Au having thicknesses of 0.1 micrometers/0.1 micrometers. The thickness of each of the second electrodes 7b is, for example, 0.2 micrometers. The second electrodes 7b are provided in, for example, circular configurations having diameters of 100 micrometers on the lower surface (FIG. 1A) of the reflective layer 6 at a pitch of 200 micrometers (referring to FIG. 1B).

The first metal post 8a is formed of, for example, a metal such as Cu in a circular columnar configuration. The height of the first metal post 8a is about, for example, 100 micrometers; and the diameter thereof is, for example, 100 micrometers. The first metal post 8a is configured to conduct current to the first electrode 7a. The configurations of the first electrode 7a and the first metal post 8a are modifiable as appropriate.

Each of the second metal posts 8b is formed of, for example, a metal such as Cu in a circular columnar configuration. The height of the second metal post 8b is, for example, 100 micrometers; and the diameter thereof is, for example, 100 micrometers. The second metal post 8b is configured to conduct current to the second electrode 7b. Similarly to the disposition of the second electrodes 7b, the second metal posts 8b are provided at a pitch of, for example, 200 micrometers (referring to FIGS. 2A and 2B). The configurations of the second electrode 7b and the second metal post 8b also are modifiable as appropriate.

The insulating layer 9 is formed of, for example, an insulating material such as $SiO_2$ and functions as a passivation film (a protective film). The thickness of the insulating layer 9 is, for example, 0.3 micrometers. The insulating layer 9 completely covers the light emitting layer 2 to the end portions thereof and prevents the flow of current to the outside except for through the first electrode 7a and the second electrodes 7b. Thereby, shorts, etc., due to the mounting solder creeping up can be prevented.

The sealing layer 10 is formed of, for example, a thermosetting resin. Similarly to each of the metal posts 8a and 8b, the thickness of the sealing layer 10 is about 100 micrometers. The sealing layer 10 is provided on the entire surface of the insulating layer 9 to seal the first metal post 8a and each of the second metal posts 8b while leaving the end portion of the first metal post 8a and the end portion of each of the second metal posts 8b exposed. Thereby, the perimeter surfaces of the first metal post 8a and each of the second metal posts 8b are completely covered with the sealing layer 10.

The sealing layer 10 also covers the side surface of the light emitting layer 2. In other words, as illustrated in FIG. 1A, the side surface of the light emitting layer 2 between the first major surface M1 and the second major surface M2 is covered with the sealing layer 10 with the insulating layer 9 interposed. This configuration may be used not only in the embodiment but similarly in all of the embodiments described below in regard to FIG. 2A to FIG. 20D. In the case where the sealing layer 10 is formed of a material that is light-shielding with respect to the light emitted from the light emitting layer 2, the leakage of the light from the side surface of the light emitting layer 2 can be prevented by the side surface of the light emitting layer 2 being covered with the sealing layer 10.

Although the insulating layer 9 is provided to completely cover the light emitting layer 2 to the end portions thereof, the embodiment is not limited thereto. For example, the sealing layer 10 may be provided over the insulating layer 9 to completely cover the light emitting layer 2 to the end portions thereof. In such a case as well, shorts, etc., due to the mounting solder creeping up can be prevented because the flow of current to the outside except for through the first electrode 7a and each of the second electrodes 7b is prevented.

The first metal layer 11a and each of the second metal layers 11b are formed of, for example, metals such as Ni/Au having thicknesses of 1.0 micrometers/0.1 micrometers. The first metal layer 11a is provided on the end portion, i.e., the exposed portion, of the first metal post 8a. The second metal layers 11b are provided on the end portions, i.e., the exposed portions, of the second metal posts 8b, respectively. The first metal layer 11a has the same circular configuration as the first electrode 7a; and the second metal layer 11b has the same circular configuration as the second electrode 7b (referring to FIG. 1B).

When a voltage is applied to the first metal post 8a and each of the second metal posts 8b in such an optical semiconductor device 1A, a potential is applied from the first metal post 8a to the first semiconductor layer 2a; a potential is applied from each of the second metal posts 8b to the second semiconductor layer 2b; and light is radiated from the active layer 2c interposed between the first semiconductor layer 2a and the second semiconductor layer 2b. A portion of the radiated light passes through the transparent layer 5 and is emitted as-is from the front surface of the transparent layer 5; and another portion is reflected by the reflective layer 6, passes through the transparent layer 5, and is emitted from the front surface of the transparent layer 5.

According to the structure of the embodiment, the device configuration is simplified; and a small optical semiconductor device 1A having the same size as the planar surface area of the light emitting layer 2 can be obtained. Further, costs can be suppressed because it is unnecessary to perform the molding and mounting processes, the connection process, etc., when manufacturing, and manufacturing is possible using normal semiconductor manufacturing apparatuses.

By forming the transparent layer 5 on the light emitting layer 2, the light extraction efficiency can be increased because it is possible to reduce the refractive index difference between the light emitting layer 2 and the air. According to the structure of the embodiment, the difference of the linear coefficient of thermal expansion between a glass epoxy substrate, which is a general wiring substrate, and the light emitting layer 2 can be reduced by the metal posts 8a and 8b even in the case where an optical semiconductor device 1A having the same planar surface area as the light emitting layer 2 is mounted to the glass epoxy substrate. As a result, the reliability when mounting the optical semiconductor device 1A can be ensured.

According to the first embodiment of the invention as described above, the optical semiconductor device 1A of the structure described above is obtained by providing a transparent inorganic substance or organic substance on the light emitting layer 2 as the transparent layer 5, providing the first metal post 8a on the first electrode 7a of the light emitting layer 2, providing the second metal post 8b on each of the second electrodes 7b of the light emitting layer 2, and providing the sealing layer 10 on the light emitting layer 2 to seal the first metal post 8a and the second metal posts 8b.

According to the optical semiconductor device 1A, a shortening of the life can be deterred in the case where the transparent layer 5 is formed of an inorganic substance, a silicone resin, etc., because the degradation of the transparent layer 5 due to the light (in particular, the blue light) radiated from the light emitting layer 2 is prevented. Also, cost reductions can be realized because manufacturing costs are reduced by simplifying the device configuration. Additionally, the optical semiconductor device 1A can be downsized to about the same size as that of a normal optical semiconductor element because the planar size of the device can be about the same as the planar surface area of the light emitting layer 2 by simplifying the device configuration.

According to the embodiment, it is also possible to provide the transparent layer 5 with an optical function.

Figure 2A:
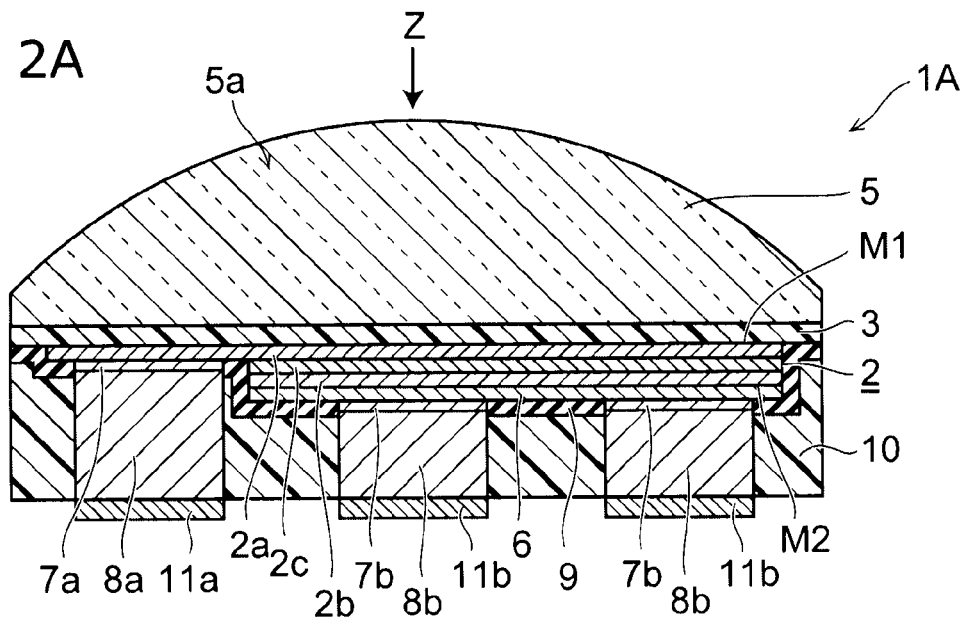
FIGS. 2A and 2B are schematic views illustrating a second specific example of the first embodiment.
Figure 2B:
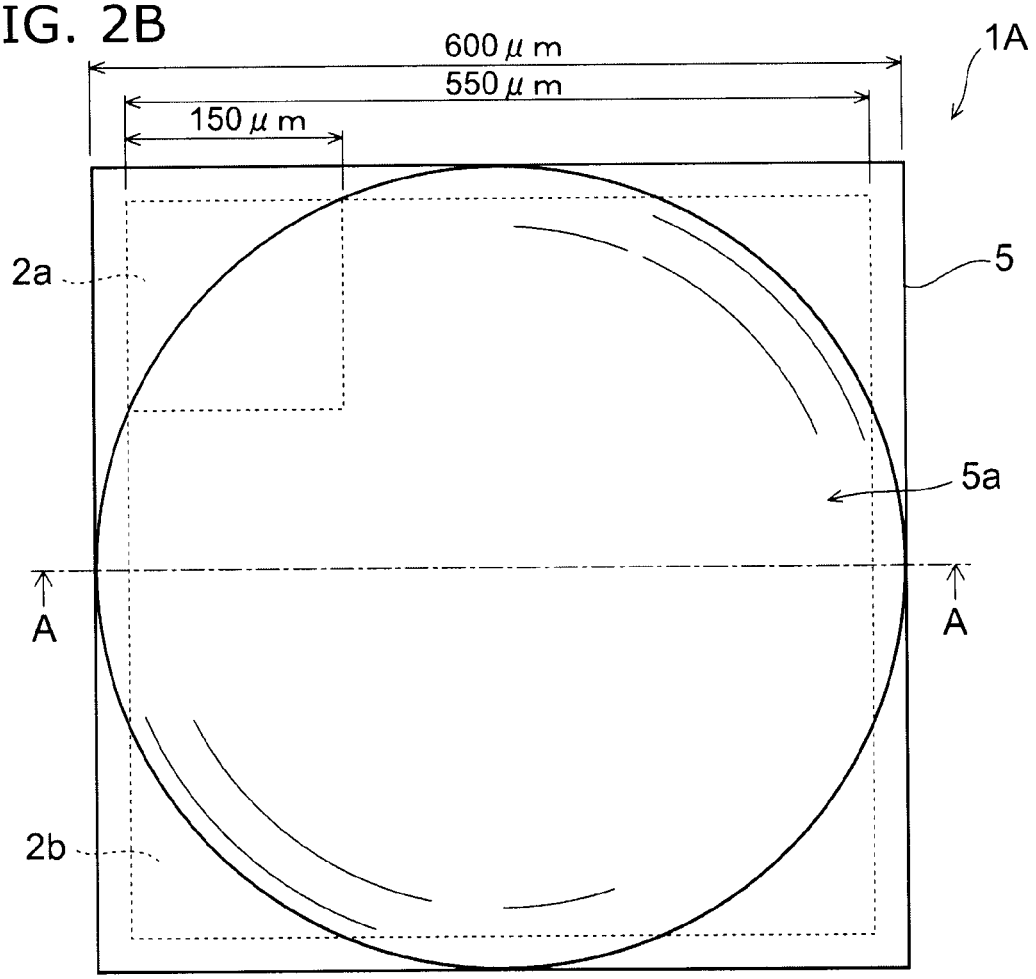

FIGS. 2A and 2B are schematic views illustrating a second specific example of the embodiment. Namely, FIG. 2A is a cross-sectional view of an optical semiconductor device of this specific example; and FIG. 2B is a plan view thereof as viewed from the Z direction. FIG. 2A illustrates a cross section along line A-A of FIG. 2B.

In the specific example, a lens 5a is formed in a protruding configuration on the light extraction surface of the transparent layer 5. Thereby, a light concentration effect of the light emitted from the light emitting layer 2 is obtained.

Figure 3A:
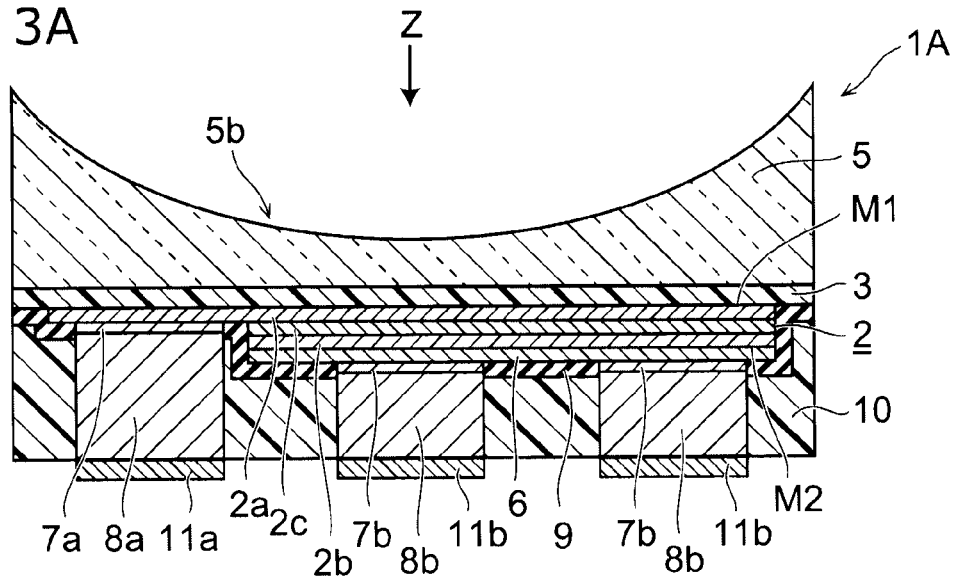
FIGS. 3A and 3B are schematic views illustrating a third specific example of the first embodiment.
Figure 3B:
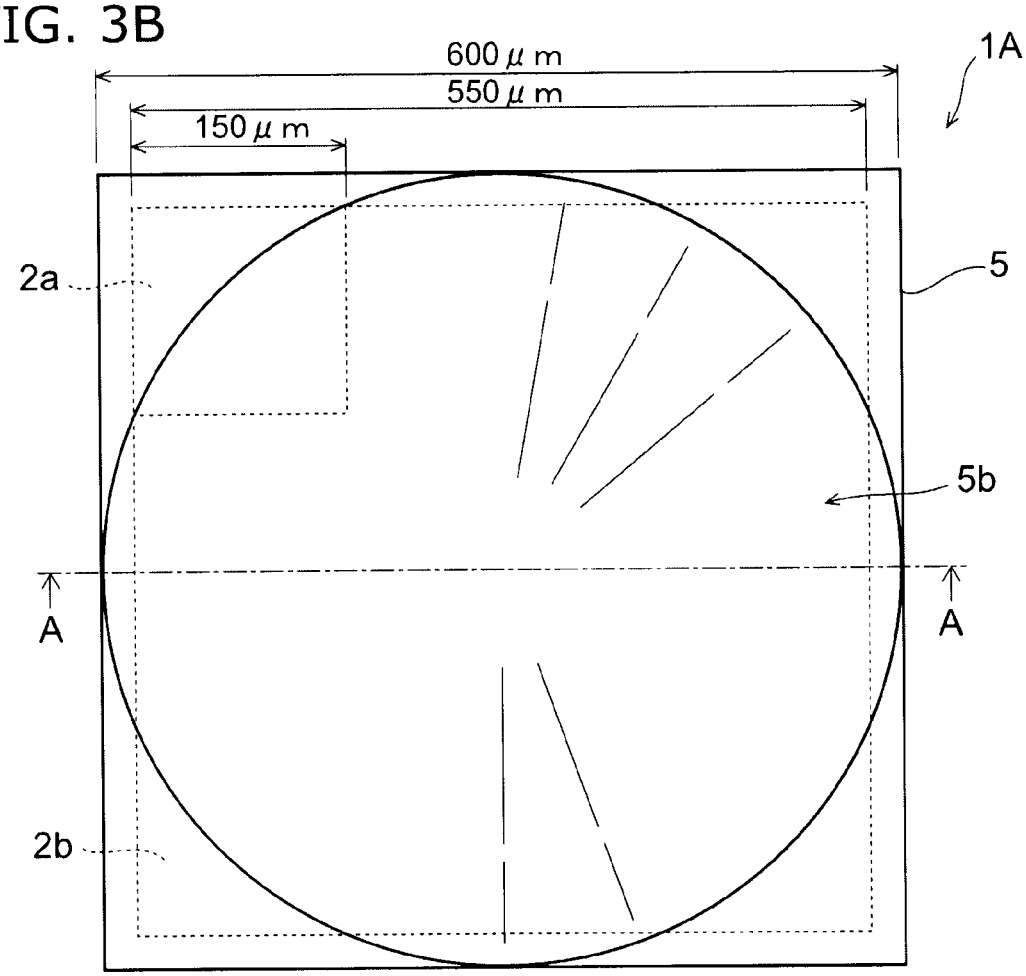

FIGS. 3A and 3B are schematic views illustrating a third specific example of the embodiment. Namely, FIG. 3A is a cross-sectional view of an optical semiconductor device of the specific example; and FIG. 3B is a plan view thereof as viewed from the Z direction. FIG. 3A illustrates the cross section along line A-A of FIG. 3B.

In the specific example, a lens 5b is formed in a concave configuration on the light extraction surface of the transparent layer 5. Thus, it is also possible to spread the light emitted from the light emitting layer 2 to control the light distribution characteristics.

Figure 4A:
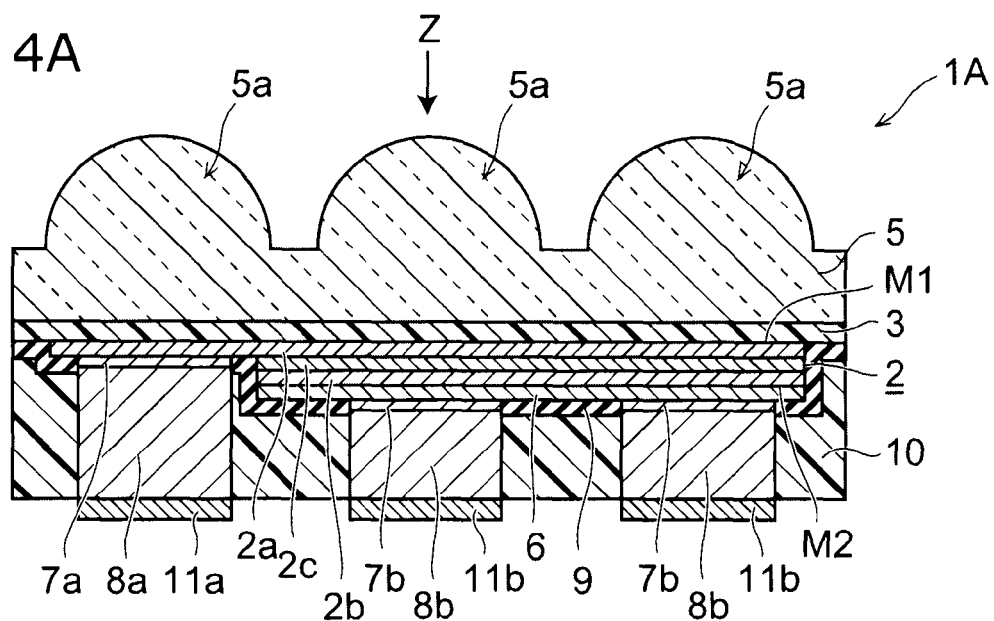
FIGS. 4A and 4B are schematic views illustrating a fourth specific example of the first embodiment.
Figure 4B:
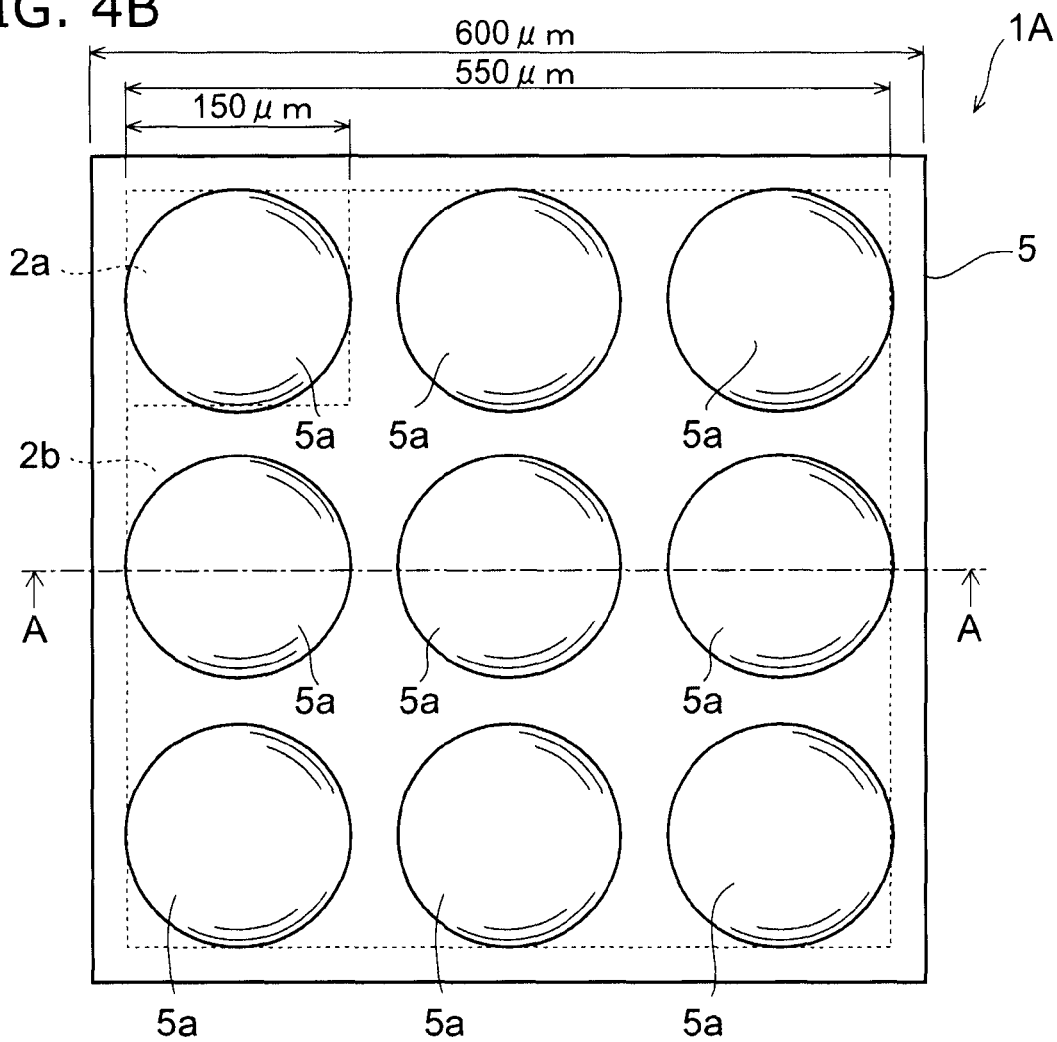

FIGS. 4A and 4B are schematic views illustrating a fourth specific example of the embodiment. Namely, FIG. 4A is a cross-sectional view of an optical semiconductor device of the specific example; and FIG. 4B is a plan view thereof as viewed from the Z direction. FIG. 4A illustrates the cross section along line A-A of FIG. 4B.

In the specific example, multiple lenses 5a are formed in protruding configurations on the light extraction surface of the transparent layer 5. Thus, it is also possible to emit the light emitted from the light emitting layer 2 as multiple converging light beams.

Figure 5A:
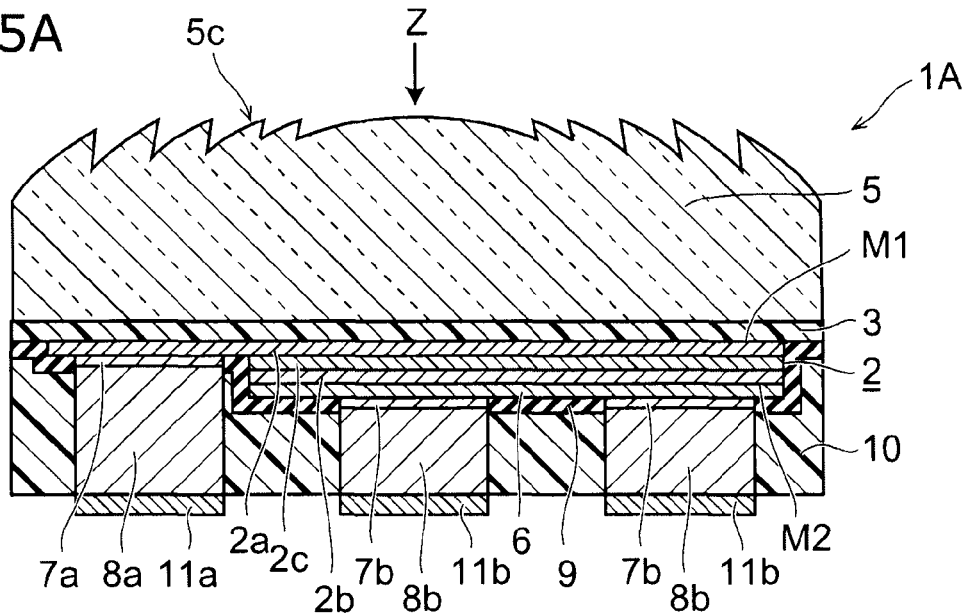
FIGS. 5A and 5B are schematic views illustrating a fifth specific example of the first embodiment.
Figure 5B:
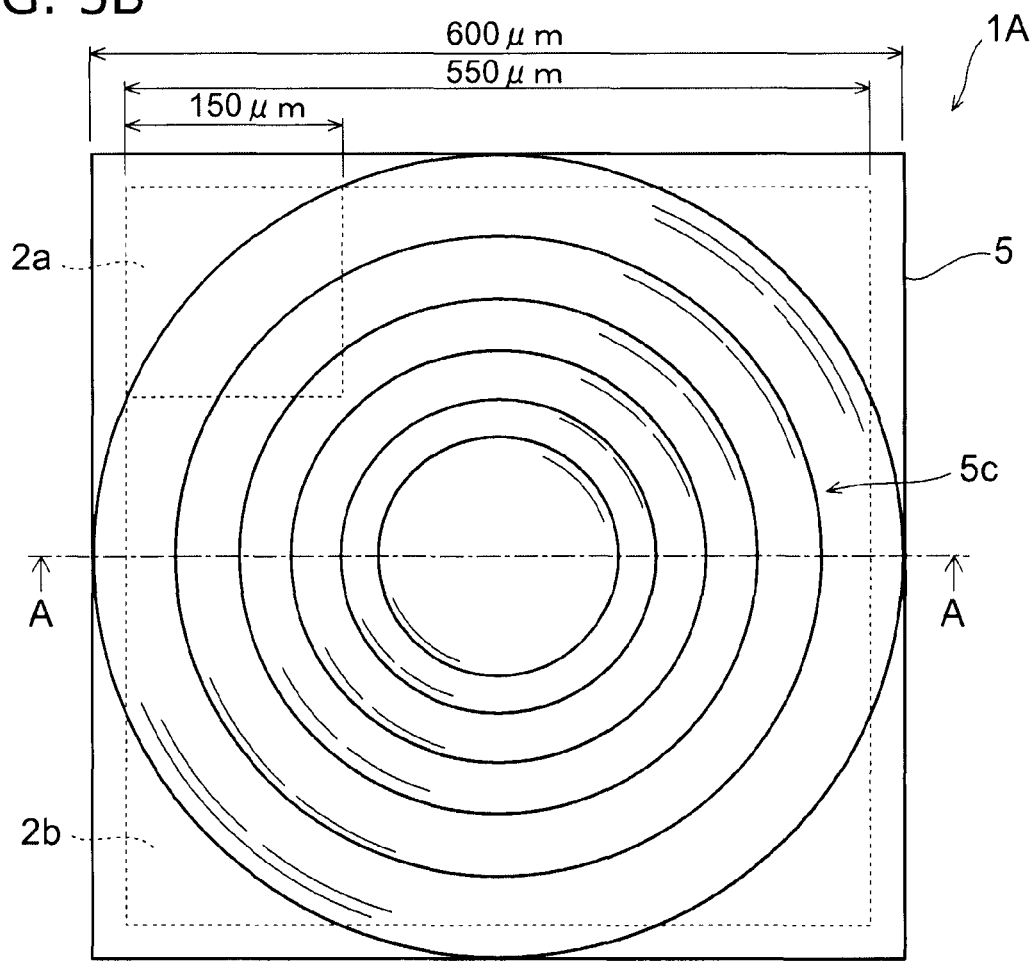

FIGS. 5A and 5B are schematic views illustrating a fifth specific example of the embodiment. Namely, FIG. 5A is a cross-sectional view of an optical semiconductor device of the specific example; and FIG. 5B is a plan view thereof as viewed from the Z direction. FIG. 5A illustrates the cross section along line A-A of FIG. 5B.

In the specific example, a Fresnel lens 5c is formed on the light extraction surface of the transparent layer 5. By forming the Fresnel lens 5c, it is possible to control the light distribution characteristics by concentrating the light emitted from the light emitting layer 2 while using a thin transparent layer 5.

According to the embodiment, the transparent layer 5 is bonded to the light emitting layer 2 by the bonding layer 3. That is, it is easy to form the transparent layer 5 beforehand as a separate member. Accordingly, it is possible to manufacture with low costs an optical semiconductor device including the transparent layer 5 having various lens configurations such as those described above in regard to FIG. 2A to FIG. 5B or other configurations to obtain other various light distribution characteristics.

Second Embodiment

A second embodiment of the invention will now be described with reference to FIG. 6. Mainly, portions of the embodiment different from those of the first embodiment will be described. Portions of the embodiment similar to portions described in regard to the first embodiment are marked with like reference numerals, and a description thereof is omitted as appropriate.

Figure 6:
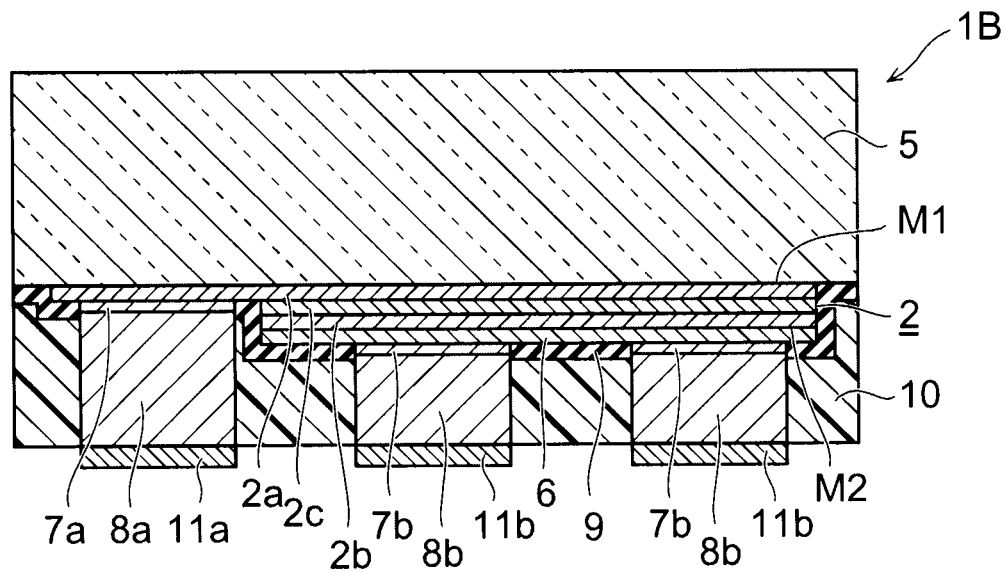
FIG. 6 is a cross-sectional view illustrating the schematic configuration of an optical semiconductor device according to a second embodiment and is a cross-sectional view corresponding to FIG. 1A.

FIG. 6 is a cross-sectional view illustrating the schematic configuration of the optical semiconductor device according to the embodiment and is a cross-sectional view corresponding to FIG. 1A.

In the embodiment, the transparent layer 5 is provided directly on the light emitting layer 2. That is, the transparent layer 5 is formed on the light emitting layer 2 without the bonding layer 3 (referring to FIGS. 1A and 1B) being interposed.

Such a structure is realizable by, for example, the transparent layer 5 being formed of a resin. For example, a resin material prior to being cured is coated onto the first major surface M1 of the light emitting layer 2. Subsequently, the resin material is cured by heat, UV (ultraviolet), etc. Thereby, the transparent layer 5 can be formed directly on the light emitting layer 2.

Or, the transparent layer 5 may be formed on the first major surface M1 of the light emitting layer 2 by, for example, coating liquid glass by a method such as spin coating and by curing the liquid glass.

According to the embodiment, in addition to the various operational effects described above in regard to the first embodiment, it is possible to suppress absorption, scattering, etc., of the light by the bonding layer 3 and further increase the light extraction efficiency.

Because the process of forming the bonding layer 3 can be eliminated from the manufacturing processes, it is possible to shorten the processes and reduce the costs.

In the embodiment as well, it is possible to provide the transmissive layer 5 with the various optical functions described above in regard to FIG. 2A to FIG. 5B. For example, it is sufficient to cure while controlling the configuration of the resin material on the first major surface M1 of the light emitting layer using a mold template corresponding to a prescribed configuration such as a convex lens, a concave lens, a Fresnel lens, etc. Alternatively, the resin material on the first major surface M1 of the light emitting layer 2 may be imprinted (template pressing) by stamping corresponding to a prescribed configuration such as a convex lens, a concave lens, a Fresnel lens, etc., prior to the curing.

Third Embodiment

A third embodiment of the invention will now be described with reference to FIG. 7. Mainly, portions of the embodiment different from those of the first and second embodiments will be described. Portions of the embodiment similar to portions described in regard to the first and second embodiments are marked with like reference numerals, and a description thereof is omitted as appropriate.

Figure 7:
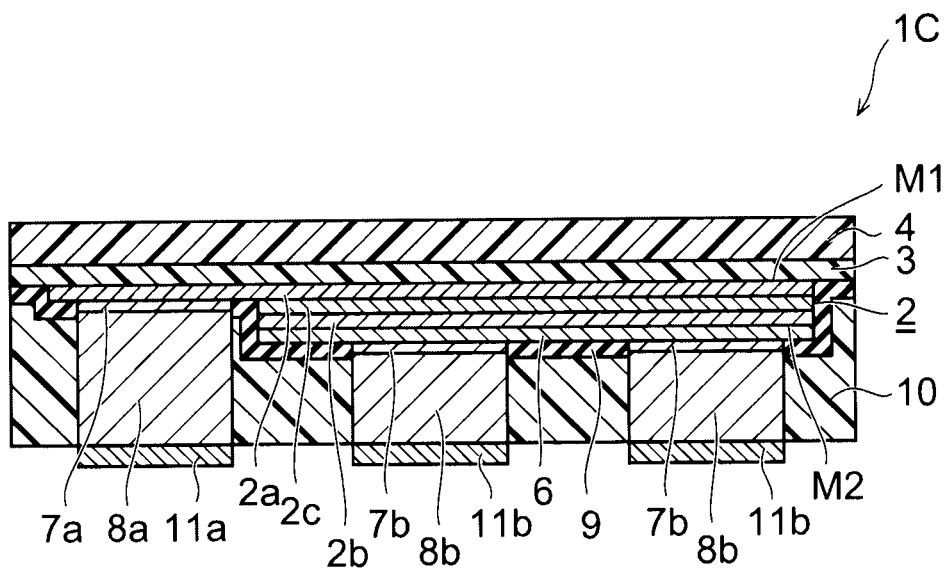
FIG. 7 is a cross-sectional view illustrating the schematic configuration of an optical semiconductor device according to a third embodiment.

FIG. 7 is a cross-sectional view illustrating the schematic configuration of an optical semiconductor device according to the embodiment.

In the embodiment, a fluorescent layer 4 is provided on the light emitting layer 2 with the bonding layer 3 interposed. The fluorescent layer 4 contains a fluorescer particle configured to convert the wavelength of the light emitted from the light emitting layer 2. Specifically, the fluorescent layer 4 has a structure in which the fluorescer particle is dispersed in an organic material such as, for example, a silicone resin. The fluorescent layer 4 also may have a fluorescer particle dispersed in an inorganic material such as, for example, silicon oxide. The thickness of the fluorescent layer 4 may be about, for example, 15 micrometers. Alternatively, the fluorescent layer 4 may be formed by bonding the fluorescer particles to each other by a binder made of an organic material or an inorganic material.

In the case where a silicone resin is used as the organic material of the fluorescent layer 4, the same type of resin as that of the bonding layer 3, i.e., methyl phenyl silicone having a refractive index of about 1.5, can be used. However, the material of the fluorescent layer 4 is not limited thereto. Other types of organic materials or inorganic materials may be used.

It is unnecessary for the fluorescer contained in the fluorescent layer 4 to have one composition. For example, a mixture of two types of fluorescers that perform wavelength conversions of blue light into green light and red light may be used. Thus, white light having high color rendition can be obtained by mixing the blue light emitted from the light emitting layer 2 and the green light and the red light undergoing the wavelength conversion by the fluorescers.

It is unnecessary for the fluorescent layer 4 to be a single layer. For example, a stacked body may be used in which a first layer, in which a fluorescer particle configured to absorb blue light and emit green light is dispersed, is stacked with a second layer, in which a fluorescer particle configured to absorb blue light and emit red light is dispersed. In such a case, losses due to green light being absorbed in the first layer can be reduced by stacking the first layer and the second layer in order from the light emitting layer 2 side.

Red fluorescers may include, for example, the following. However, the red fluorescer of the embodiments is not limited to the following:

$Y_2O_2S$:Eu
$Y_2O_2S$:Eu+pigment
$Y_2O_3$:Eu
$Zn_3(PO_4)_2$:Mn
(Zn, Cd)S:Ag+$In_2O_3$
(Y, Gd, Eu)$BO_3$
(Y, Gd, Eu)$_2O_3$
$YVO_4$:Eu
$La_2O_2S$:Eu, Sm LaSi$_3$N$_5$:Eu$^{2+}$
α-sialon:Eu$^{2+}$
CaAlSiN$_3$:Eu$^{2+}$
CaSiN$_x$:Eu$^{2+}$
CaSiN$_x$:Ce$^{2+}$
M$_2$Si$_5$N$_8$Eu$^{2+}$
CaAlSiN$_3$:Eu$^{2+}$
(SrCa)AlSiN$_3$:Eu$^{x+}$
Sr$_x$(Si$_y$Al$_3$)$_z$(O$_x$N):Eu$^{x+}$ Green fluorescers may include, for example, the following. However, the green fluorescer of the embodiments is not limited to the following:
ZnS:Cu, Al
ZnS:Cu, Al+pigment
(Zn, Cd)S:Cu, Al
ZnS:Cu, Au, Al,+pigment
Y$_3$Al$_5$O$_{12}$:Tb
Y$_3$(Al, Ga)$_5$O$_{12}$:Tb
Y$_2$SiO$_5$:Tb
Zn$_2$SiO$_4$:Mn
(Zn, Cd)S:Cu
ZnS:Cu
Zn$_2$SiO$_4$:Mn
ZnS:Cu+Zn$_2$SiO$_4$:Mn
Gd$_2$O$_2$S:Tb
(Zn, Cd)S:Ag
ZnS:Cu, Al
Y$_2$O$_2$S:Tb
ZnS:Cu, Al+In$_2$O$_3$
(Zn, Cd)S:Ag+In$_2$O$_3$
(Zn, Mn)$_2$SiO$_4$
BaAl$_{12}$O$_{19}$:Mn
(Ba, Sr, Mg)O.aAl$_2$O$_3$:Mn
LaPO$_4$:Ce, Tb
Zn$_2$SiO$_4$:Mn
ZnS:Cu
3(Ba, Mg, Eu, Mn)O.8Al$_2$O$_3$
La$_2$O$_3$.0.2SiO$_2$.0.9P$_2$O$_5$:Ce, Tb
CeMgAl$_{11}$O$_{19}$:Tb
CaSc$_2$O$_4$:Ce
(BrSr)SiO$_4$:Eu
α-sialon:Yb$^{2+}$
β-sialon:Eu$^{2+}$
(SrBa)YSi$_4$N$_7$:Eu$^{2+}$
(CaSr)Si$_2$O$_4$N$_7$:EU$^{2+}$
Sr(SiAl)(ON):Ce Blue fluorescers may include, for example, the following. However, the blue fluorescer of the embodiments is not limited to the following:
ZnS:Ag
ZnS:Ag+pigment
ZnS:Ag, Al
ZnS:Ag, Cu, Ga, Cl
ZnS:Ag+In$_2$O$_3$
ZnS:Zn+In$_2$O$_3$
(Ba, Eu)MgAl$_{10}$O$_{17}$
(Sr, Ca, Ba, Mg)$_{10}$(PO$_4$)6Cl$_2$:Eu
Sr$_{10}$(PO$_4$)6Cl$_2$:Eu
(Ba, Sr, Eu)(Mg, Mn)Al$_{10}$O$_{17}$
10(Sr, Ca, Ba, Eu).6PO$_4$.Cl$_2$
BaMg$_2$Al$_{16}$O$_{25}$:Eu Yellow fluorescers may include, for example, the following. However, the yellow fluorescer of the embodiments is not limited to the following:
Li(Eu, Sm)W$_2$O$_8$
(Y, Gd)$_3$, (Al, Ga)$_5$O$_{12}$:Ce$^{3+}$
Li$_2$SrSiO$_4$:Eu$^{2+}$
(Sr(Ca, Ba))$_3$SiO$_5$:Eu$^{2+}$
SrSi$_2$ON$_{2.7}$:Eu$^{2+}$ According to the structure of the embodiment, light of diverse wavelength bands can be obtained by providing the fluorescent layer 4, which performs a wavelength conversion of light, on the light emitting layer 2. For example, in the case where blue light is emitted from the light emitting layer 2, white light can be obtained by the fluorescent layer 4 containing a fluorescer configured to absorb the blue light and emit yellow light. That is, white light is obtained by mixing the blue light from the light emitting layer 2 and the yellow light from the fluorescent layer 4.

According to the structure of the embodiment, the optical semiconductor device 1C can emit white light in the upper surface direction by emitting the blue light only in the upward direction by forming the reflective layer 6 on the lower surface (in FIG. 7) of the light emitting layer 2.

By dispersing a fluorescer particle in a material such as resin, glass, etc., as the fluorescent layer 4, the light extraction efficiency can be increased because it is possible to reduce the refractive index difference between the fluorescent layer 4 and the air.

In the specific example as illustrated in FIG. 7, the fluorescent layer 4 includes a portion outside the circumferential edge of the light emitting layer 2 when viewed along the stacking direction from the first major surface M1 toward the second major surface M2. In other words, the fluorescent layer 4 juts outside the light emitting layer 2 when viewed in plan. Thereby, the light emitted from the light emitting layer 2 efficiently passes through the fluorescent layer 4; and the conversion efficiency of the wavelength of the light can be increased.

Fourth Embodiment

A fourth embodiment of the invention will now be described with reference to FIG. 8. Mainly, portions of the embodiment different from those of the first to third embodiments will be described. Portions of the embodiment similar to portions described in regard to the first to third embodiments are marked with like reference numerals, and a description thereof is omitted as appropriate.

Figure 8:
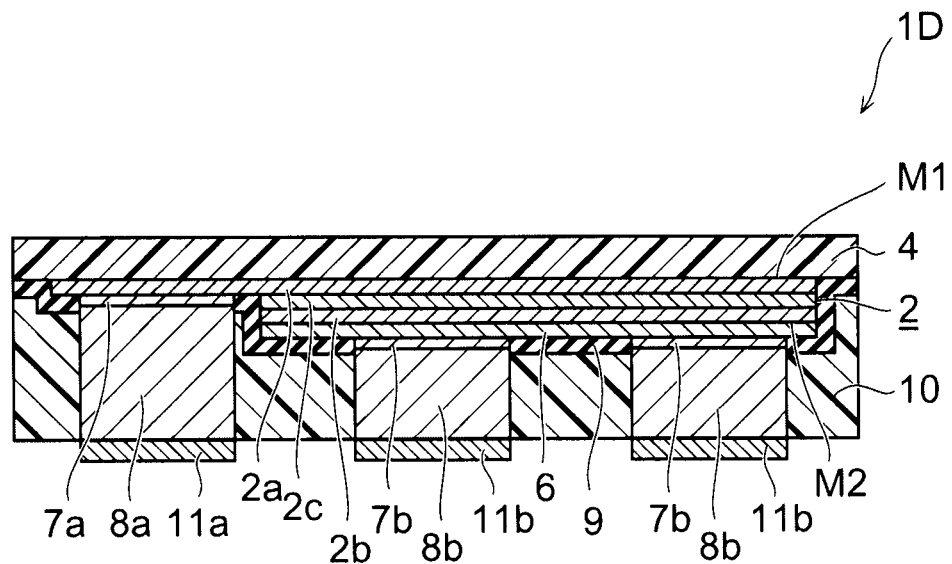
FIG. 8 is a cross-sectional view illustrating the schematic configuration of an optical semiconductor device according to a fourth embodiment.

FIG. 8 is a cross-sectional view illustrating the schematic configuration of an optical semiconductor device according to the embodiment.

In the embodiment, the fluorescent layer 4 is provided directly on the light emitting layer 2. In other words, the fluorescent layer 4 is formed on the light emitting layer 2 without the bonding layer 3 (referring to FIG. 7) being interposed.

Such a structure is realizable by, for example, forming the fluorescent layer 4 using a resin. For example, a resin material, in which a fluorescer particle is dispersed, is coated onto the first major surface M1 of the light emitting layer 2 prior to being cured. Subsequently, the resin material is cured using heat, UV (ultraviolet), etc. Thereby, the fluorescent layer 4 can be formed directly on the light emitting layer 2. It is advantageous to use a silicone resin as the resin included in the fluorescent layer 4 because the durability to blue light and ultraviolet light is high, and degradation such as discoloration can be suppressed even when turned on for long periods of time.

Or, the fluorescent layer 4 can be formed on the first major surface M1 of the light emitting layer 2 by, for example, using a method such as spin coating to coat liquid glass in which a fluorescer particle is dispersed and by curing the liquid glass. In such a case as well, it is advantageous because glass has a high durability to blue light and ultraviolet light, and degradation such as discoloration can be suppressed even when turned on for long periods of time.

Alternatively, the fluorescent layer 4 may be formed on the light emitting layer 2 using sputtering or CVD (Chemical Vapor Deposition). In other words, the material of the fluorescer may be deposited on the light emitting layer 2 using sputtering or CVD. Thus, it is possible to form a fluorescent layer 4 that contains the fluorescer with a high concentration.

In the embodiment as well, it is unnecessary for the fluorescent layer 4 to be a single layer. For example, a stacked body may be used in which a first layer, in which a fluorescer particle configured to absorb the blue light and emit green light is dispersed, is stacked with a second layer, in which a fluorescer particle configured to absorb the blue light and emit red light is dispersed.

According to the embodiment, in addition to the various operational effects described above in regard to the third embodiment, it is possible to suppress absorption, scattering, etc., of the light by the bonding layer 3 and further increase the light extraction efficiency.

Fifth Embodiment

A fifth embodiment of the invention will now be described with reference to FIGS. 9A to 9D. Mainly, portions of the embodiment different from those of the first to fourth embodiments will be described. Portions of the embodiment similar to portions described in regard to the first to fourth embodiments are marked with like reference numerals, and a description thereof is omitted as appropriate.

FIGS. 9A to 9D are cross-sectional views illustrating the schematic configuration of optical semiconductor devices according to the embodiment.

Figure 9A:
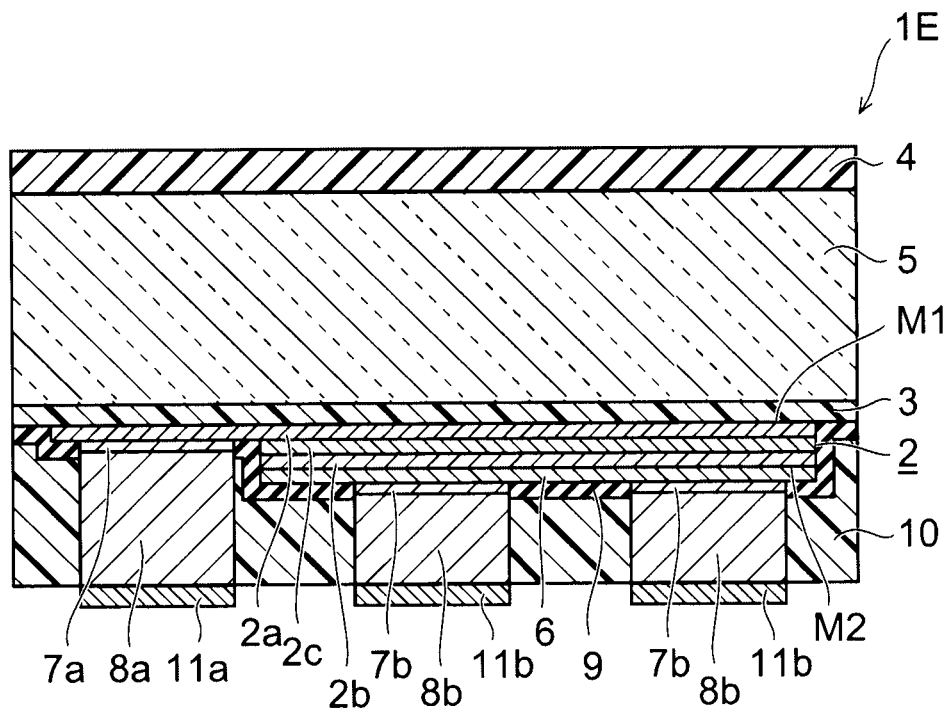
FIGS. 9A to 9D are cross-sectional views illustrating the schematic configuration of optical semiconductor devices according to a fifth embodiment.

As shown in FIG. 9A, in the optical semiconductor device 1E according to the embodiment, the transparent layer 5 and the fluorescent layer 4 are provided in this order on the light emitting layer 2 with the bonding layer 3 interposed. The bonding layer 3 and the transparent layer 5 may be similar to those described above in regard to the first embodiment. The fluorescent layer 4 may be similar to those described above in regard to the third and fourth embodiments.

For example, a resin material, in which a fluorescer particle is dispersed, is coated onto the transparent layer 5 prior to being cured. Subsequently, the resin material is cured by heat, UV (ultraviolet), etc. Thereby, the fluorescent layer 4 can be formed directly on the transparent layer 5. Thus, it is sufficient for the transparent layer 5 having the fluorescent layer 4 formed thereon to be bonded to the light emitting layer 2 with the bonding layer 3 interposed.

It is advantageous to use a silicone resin as the resin included in the fluorescent layer 4 because the durability to blue light and ultraviolet light is high, and degradation such as discoloration can be suppressed even when turned on for long periods of time.

Or, the fluorescent layer 4 can be formed on the transparent layer 5 by, for example, using a method such as spin coating to coat liquid glass in which a fluorescer particle is dispersed and by curing the liquid glass. In such a case as well, it is advantageous because glass has a high durability to blue light and ultraviolet light, and degradation such as discoloration can be suppressed even when turned on for long periods of time.

Alternatively, the fluorescent layer 4 may be formed on the transparent layer 5 using sputtering or CVD (Chemical Vapor Deposition). In other words, the material of the fluorescer can be deposited on the light emitting layer 2 using sputtering or CVD. Thus, it is possible to form a fluorescent layer 4 that contains the fluorescer with a high concentration.

According to the embodiment, it is possible to increase the uniformity of the light distribution characteristics or the distribution of the luminance by first guiding the light emitted from the light emitting layer 2 into the transparent layer 5. In other words, it is possible for the transparent layer 5 to act as a light guide to reduce unevenness of the luminance of the light when the light emitted from the light emitting layer 2 enters the transparent layer 5 and propagates through the transparent layer 5. It is possible to increase the uniformity of uneven color of the light emitted to the outside by the light having the reduced luminance unevenness entering the fluorescent layer 4 and undergoing wavelength conversion.

For example, in the case where white light is extracted to the outside by blue light being emitted from the light emitting layer 2 and a portion thereof being converted into yellow light in the fluorescent layer 4, there are cases where the blue component becomes intense if the intensity of the blue light entering the fluorescent layer 4 is high. That is, unevenness occurs in the blue component of the white light extracted to the outside via the fluorescent layer 4 in the case where there is unevenness in the luminance of the blue light emitted from the light emitting layer 2. This may be recognized as uneven color by the observer.

Conversely, in the embodiment, unevenness of the luminance is reduced by the light emitted from the light emitting layer 2 first being guided into the transparent layer 5 and guided therethrough. As a result, the uneven color of the light extracted to the outside also can be mitigated.

Figure 9B:
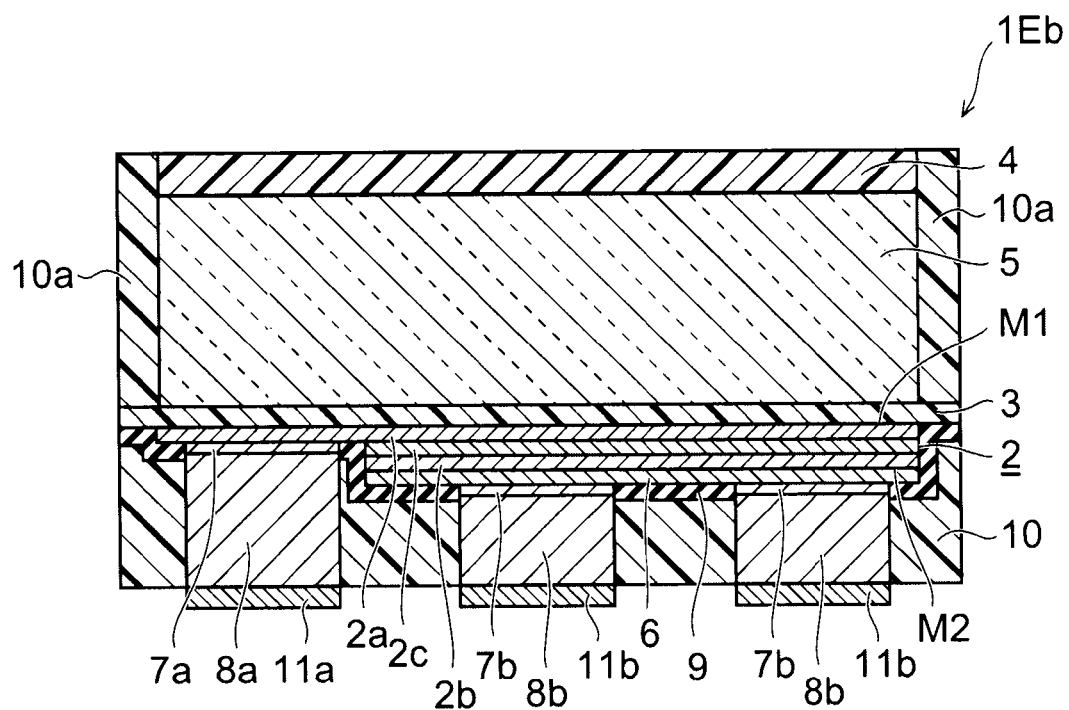
Figure 9C:
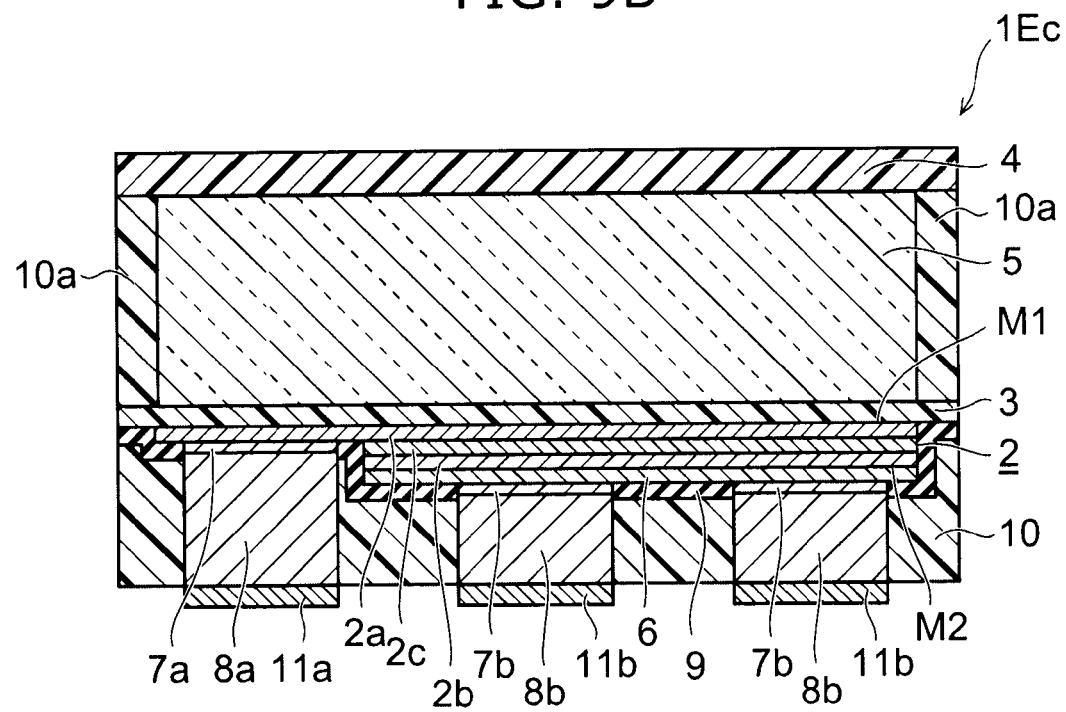

As shown in FIGS. 9B and 9C, in other optical semiconductor devices 1Eb and 1Ec according to the embodiment, a light shield layer 10a is provided on the side face of the transparent layer 5. A material used for the light shield layer 10a may be same as a material used for the sealing layer 10. Or, the material used for the light shield layer 10a may be different from the material used for the sealing layer 10.

Figure 9D:
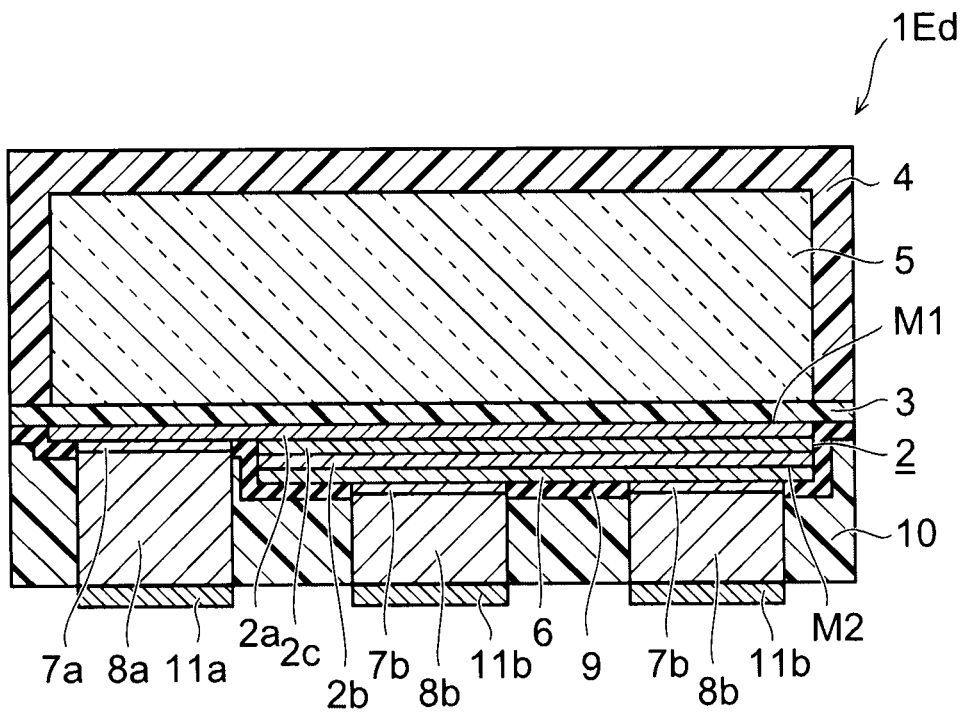

As shown in FIG. 9D, in another optical semiconductor device 1Ed according to the embodiment, the fluorescent layer 4 is provided further on the side face of the transparent layer 5.

By the optical semiconductor devices 1Eb, 1Ec and 1Ed, light passing through the transparent layer 5 does not exit to the outside directly. Thereby, the uneven color of the light extracted to the outside also can be further mitigated.

Sixth Embodiment

A sixth embodiment of the invention will now be described with reference to FIGS. 10A to 10D. Mainly, portions of the embodiment different from those of the first to fifth embodiments will be described. Portions of the embodiment similar to portions described in regard to the first to fifth embodiments are marked with like reference numerals, and a description thereof is omitted as appropriate.

FIGS. 10A to 10D are cross-sectional views illustrating the schematic configuration of optical semiconductor devices according to the embodiment.

Figure 10A:
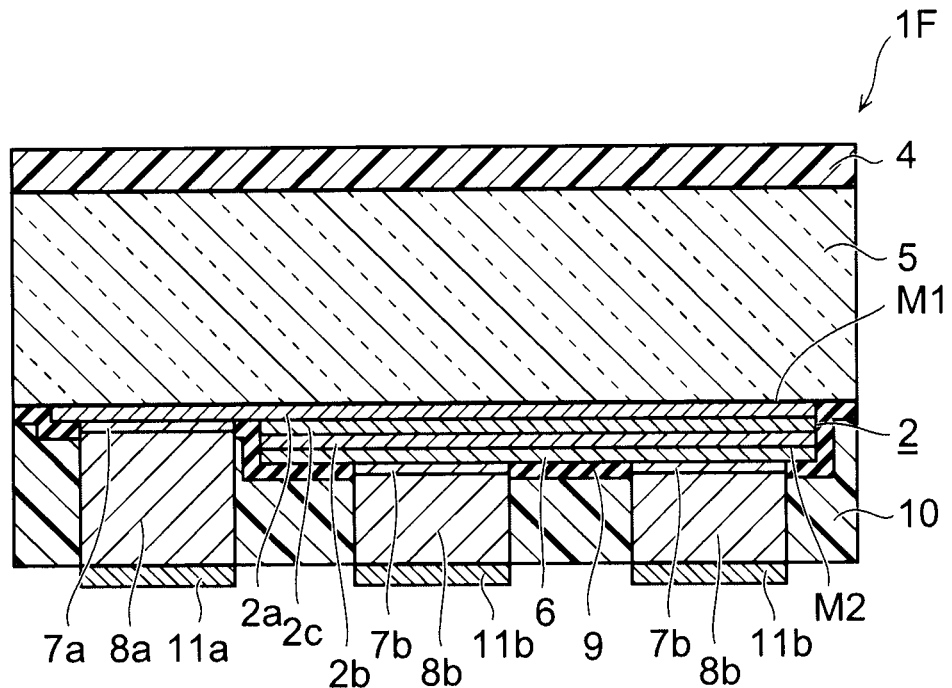
FIGS. 10A to 10D are cross-sectional views illustrating the schematic configuration of optical semiconductor devices according to a sixth embodiment.

As shown in FIG. 10A, in the optical semiconductor device 1E according to the embodiment, the transparent layer 5 and the fluorescent layer 4 are provided in this order on the light emitting layer 2. That is, the transparent layer 5 and the fluorescent layer 4 are provided directly on the light emitting layer 2 without the bonding layer 3 (referring to FIG. 9A) being interposed.

The transparent layer 5 may be similar to that described above in regard to the second embodiment. The fluorescent layer 4 may be similar to those described above in regard to the third to fifth embodiments.

In the embodiment as well, the effects described above in regard to the fifth embodiment can be obtained similarly by providing the transparent layer 5 and the fluorescent layer 4 in this order on the light emitting layer 2.

In the embodiment, the absorption, scattering, etc., of the light by the bonding layer 3 is suppressed and the light extraction efficiency can be increased further because the bonding layer 3 is not used.

Because the process of forming the bonding layer 3 can be eliminated from the manufacturing processes, it is possible to shorten the processes and reduce the costs.

Figure 10B:
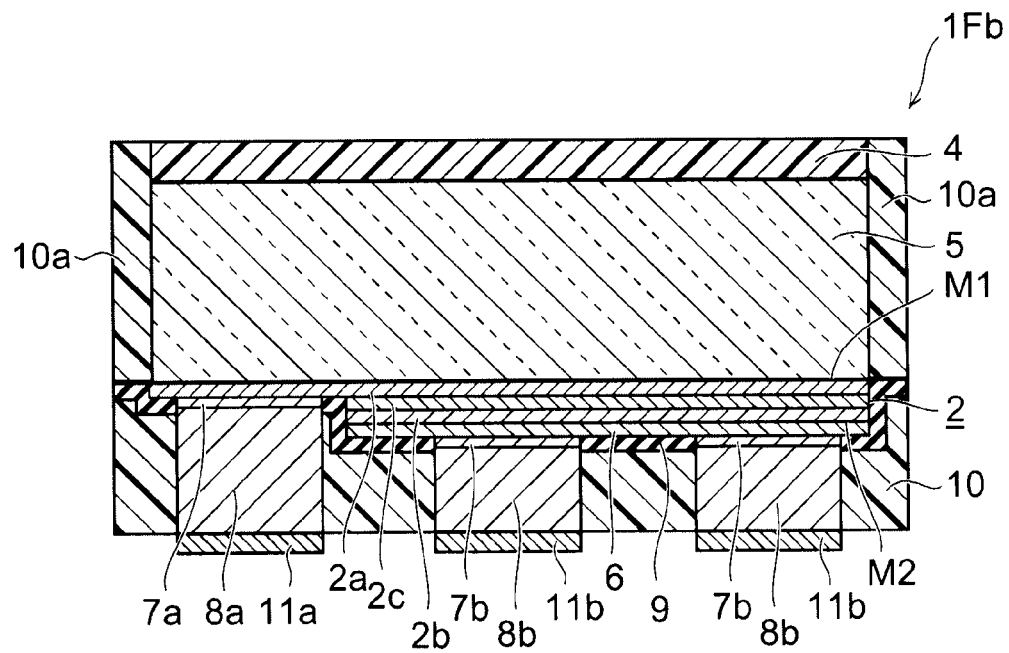
Figure 10C:
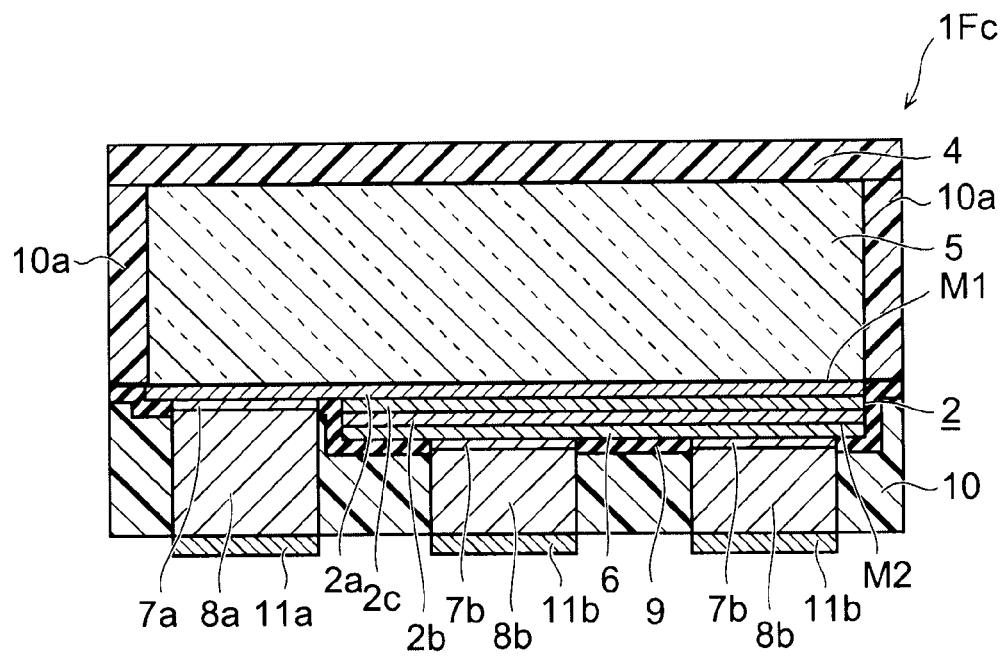

As shown in FIGS. 10B and 10c, in other optical semiconductor devices 1Fb and 1Fc according to the embodiment, a light shield layer 10a is provided on the side face of the transparent layer 5. A material used for the light shield layer 10a may be same as a material used for the sealing layer 10. Or, the material used for the light shield layer 10a may be different from the material used for the sealing layer 10.

Figure 10D:
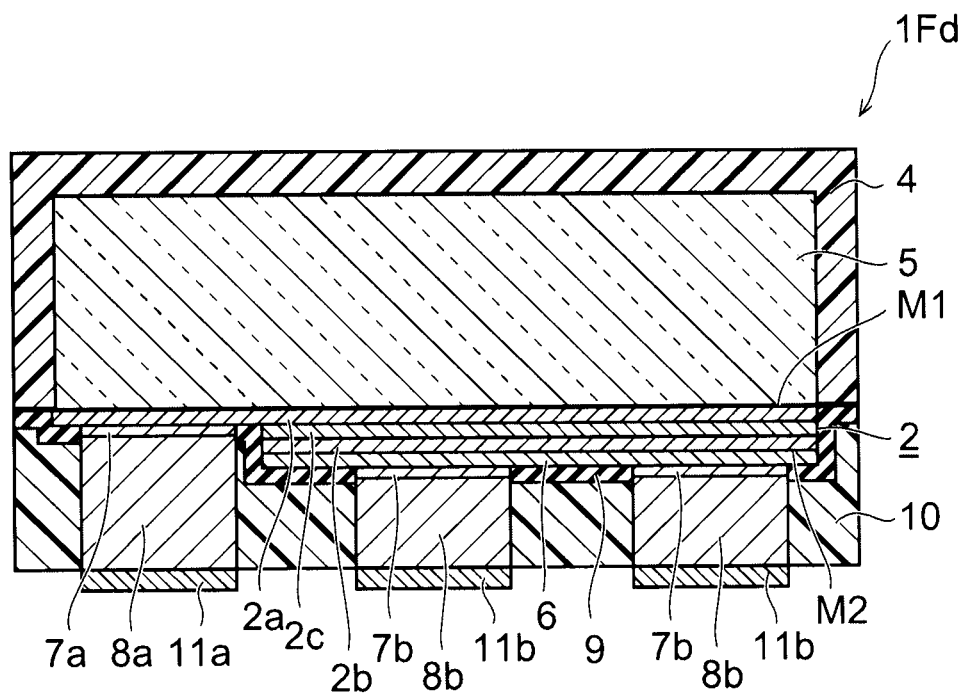

As shown in FIG. 10D, in another optical semiconductor device 1Fd according to the embodiment, the fluorescent layer 4 is provided further on the side face of the transparent layer 5.

By the optical semiconductor devices 1Fb, 1Fc and 1Fd, light passing through the transparent layer 5 does not exit to the outside directly. Thereby, the uneven color of the light extracted to the outside also can be further mitigated.

Seventh Embodiment

A seventh embodiment of the invention will now be described with reference to FIG. 11. Mainly, portions of the embodiment different from those of the first to sixth embodiments will be described. Portions of the embodiment similar to portions described in regard to the first to sixth embodiments are marked with like reference numerals, and a description thereof is omitted as appropriate.

Figure 11:
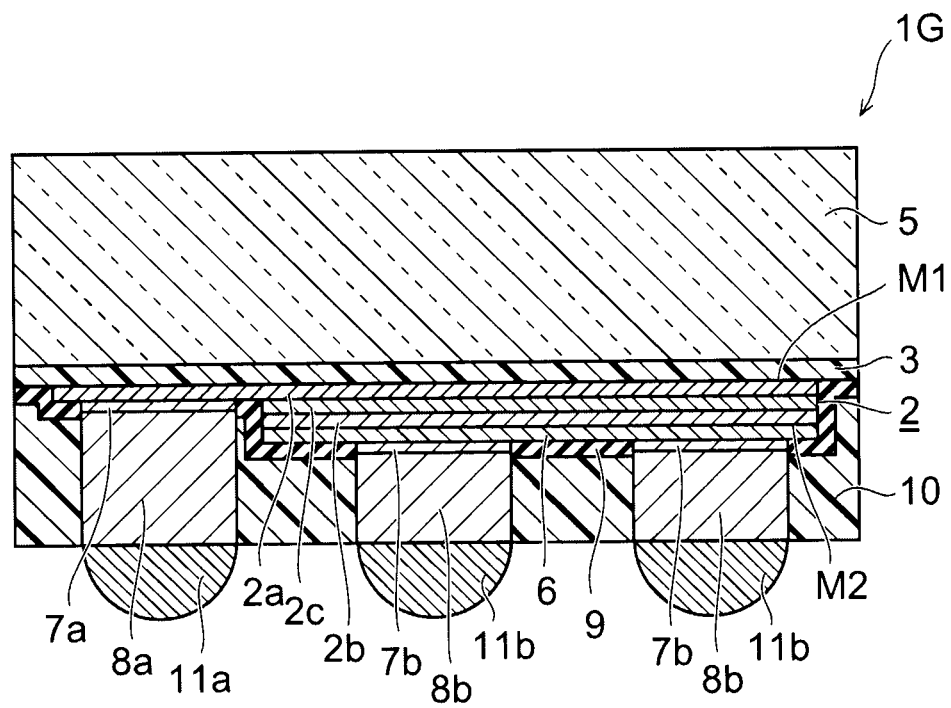
FIG. 11 is a cross-sectional view illustrating the schematic configuration of an optical semiconductor device according to a seventh embodiment.

FIG. 11 is a cross-sectional view illustrating the schematic configuration of an optical semiconductor device according to the embodiment.

In the optical semiconductor device 1G according to the embodiment, the first metal layer 11a and the second metal layers 11b are solder bumps. In other words, a solder bump having a hemispherical configuration of 100 micrometers in diameter is formed on the first metal post 8a and each of the second metal posts 8b. The composition of the solder bump is that of a solder material used in surface mounting such as Sn-3.0Ag-0.5Cu, Sn-0.8Cu, Sn-3.5Ag, etc.

According to the embodiment, effects similar to those of the first embodiment can be obtained. Also, in the case where the optical semiconductor device 1G is mounted to a wiring substrate, because the first metal layer 11a and the second metal layer 11b are formed of solder bumps, the stress occurring due to the linear coefficient of thermal expansion difference when heating can be mitigated further because the gap between the optical semiconductor device 1G and the wiring substrate is higher than that of the optical semiconductor device 1A according to the first embodiment due to the solder bumps.

Metal bumps formed of, for example, indium, etc., may be provided instead of the solder bumps. The bonding of such metal bumps is possible by compression bonding while applying, for example, heat and/or ultrasonic waves.

Although the structure of the first embodiment is illustrated in FIG. 11, the embodiment is not limited thereto. In other words, similar operational effects can be obtained by providing solder bumps or metal bumps in any of the second to sixth embodiments.

Eighth Embodiment

An eighth embodiment of the invention will now be described with reference to FIGS. 12A and 12B. Portions of the eighth embodiment of the invention different from those of the first to seventh embodiments will be described. Portions of the eighth embodiment similar to portions described in regard to the first to seventh embodiments are marked with like reference numerals, and a description is omitted.

Figure 12A:
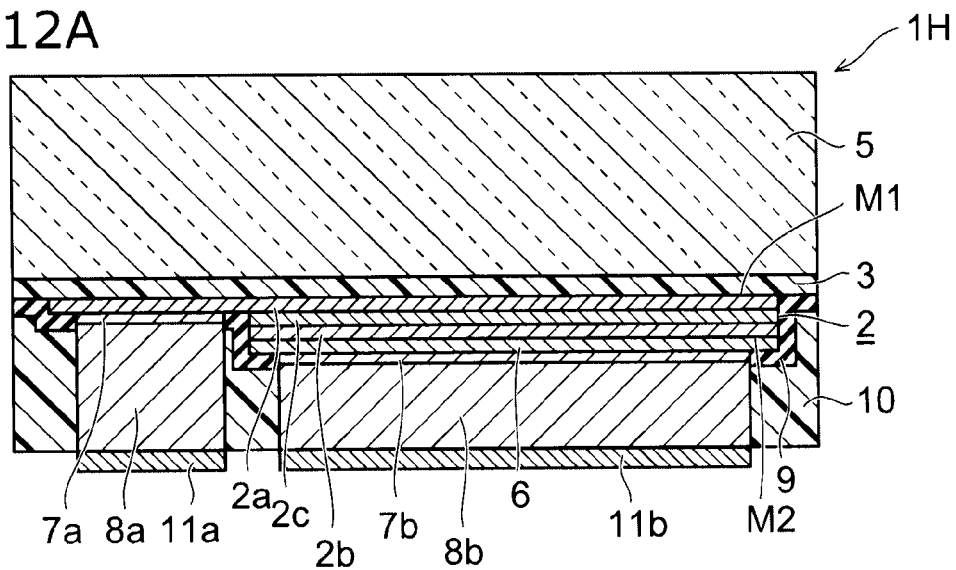
FIG. 12A is a cross-sectional view illustrating the schematic configuration of an optical semiconductor device according to an eighth embodiment.

FIG. 12A is a cross-sectional view illustrating the schematic configuration of an optical semiconductor device according to the embodiment. FIG. 12B is a plan view illustrating the lower surface of the optical semiconductor device illustrated in FIG. 12A.

In the optical semiconductor device 1H according to the embodiment, a square first electrode 7a, for example, having sides of 100 micrometers is formed on the lower surface of the first cladding layer 2a. On the other hand, the second electrode 7b of the lower surface of the second cladding layer 2b has a configuration of, for example, a square having sides of 500 micrometers from which a square corner region of the first cladding layer 2a having sides of, for example, 150 micrometers is removed. The configuration of the first metal post 8a is a prism having a rectangular parallelepiped configuration with the same planar configuration as that of the first electrode 7a; and the configuration of the second metal post 8b is a prism with the same planar configuration as that of the second electrode 7b. The first metal layer 11a has the same planar configuration as the first electrode 7a; and the second metal layer 11b has the same planar configuration as the second electrode 7b (referring to FIG. 12B).

According to the embodiment, effects similar to those of the first embodiment can be obtained. Compared to the optical semiconductor device 1A according to the first embodiment, the amount of heat generated when a current is input can be reduced and excessive thermal resistance can be drastically reduced due to the decrease of the thermal resistance because the heat dissipation path for releasing the heat generated by the light emission is increased by increasing the planar surface areas of the first electrode 7a and the second electrode 7b, that is, by enlarging the first metal post 8a and the second metal post 8b.

Figure 12B:
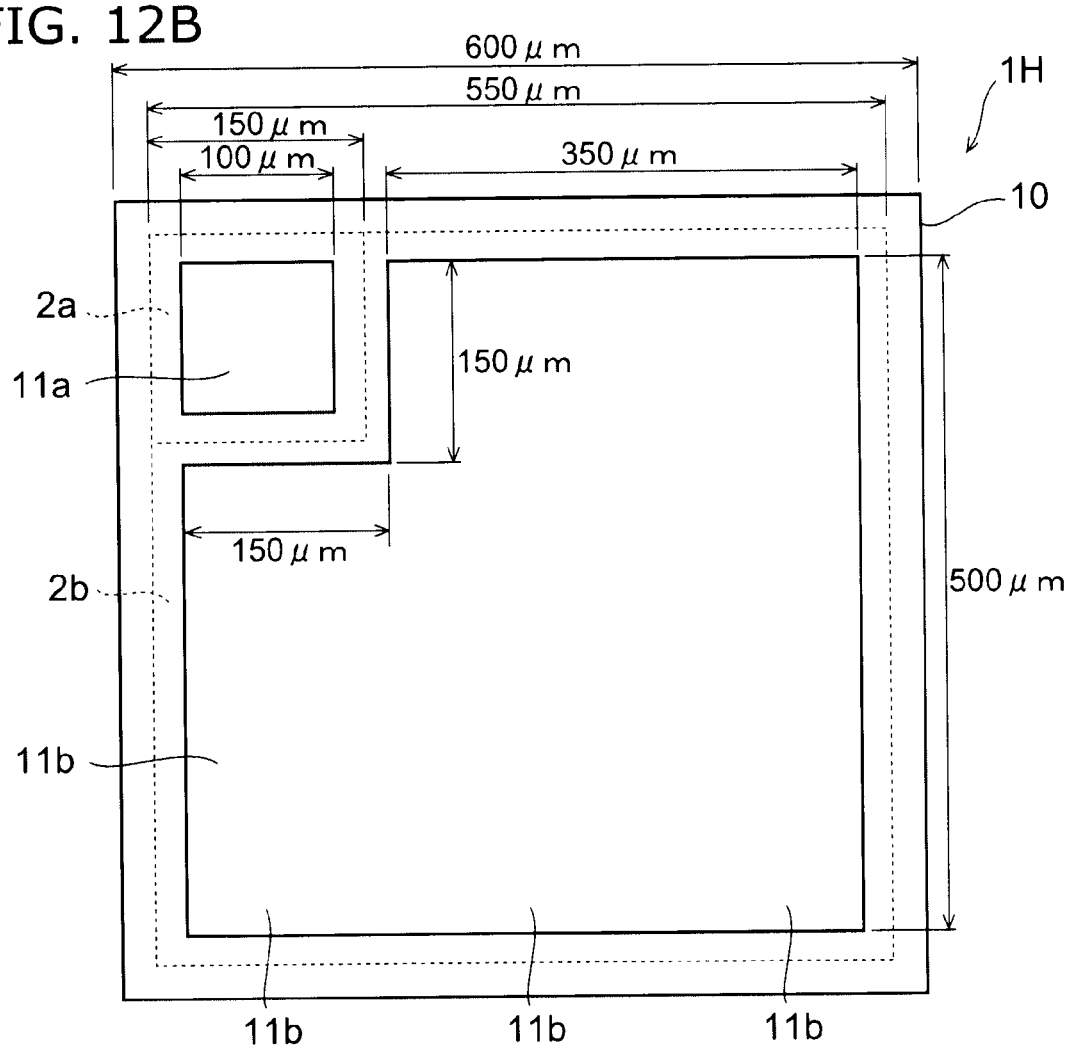
FIG. 12B is a plan view illustrating the lower surface of the optical semiconductor device illustrated in FIG. 12A.

Although the structure of the first embodiment is illustrated in FIGS. 12A and 12B, the embodiment is not limited thereto. In other words, the amount of heat generated when a current is input can be reduced and the excessive thermal resistance can be drastically reduced due to the decrease of the thermal resistance by increasing the planar surface areas of the first electrode 7a and the second electrode 7b in any of the second to sixth embodiments.

Ninth Embodiment

A ninth embodiment of the invention will now be described with reference to FIG. 13A to FIG. 15D. The embodiment is a method for manufacturing the optical semiconductor device 1A according to the first embodiment and the optical semiconductor device 1C according to the third embodiment. Portions in the description of the embodiment similar to portions described in regard to the first to eighth embodiments are marked with like reference numerals, and a description is omitted.

FIG. 13A to FIG. 15D are cross-sectional views of processes, illustrating the method for manufacturing the optical semiconductor device of the embodiment. Here, the method for manufacturing the optical semiconductor device 1A according to the first embodiment is illustrated as an example.

Figure 13A:
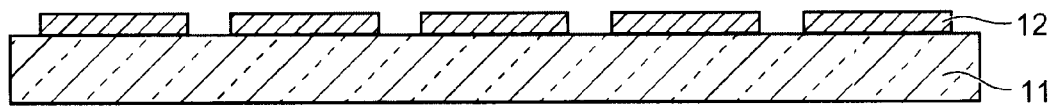
FIGS. 13A to 13D are cross-sectional views of processes, illustrating a method for manufacturing an optical semiconductor device of a ninth embodiment.

First, as illustrated in FIG. 13A, a light emitting layer 12 of, for example, InGaN that emits blue light is formed on a substrate 11, which is, for example, a sapphire wafer having a diameter of 2 inches and a thickness of 200 micrometers. First, an initial light emitting layer used to form the light emitting layer 12 is epitaxially grown as a film; and the light emitting layer is singulated using RIE (reactive ion etching).

Thereby, the light emitting layer 2 of the optical semiconductor device 1A is formed. The light emitting layer 2 is formed by, for example, forming the first cladding layer 2a in a film in a square region having sides of 550 micrometers and by forming the second cladding layer 2b in a film with the active layer 2c interposed on the lower surface of the first cladding layer 2a in a region excluding the corner region of the first cladding layer 2a (the square having sides of 150 micrometers) (referring to FIGS. 1A and 1B).

Figure 13B:
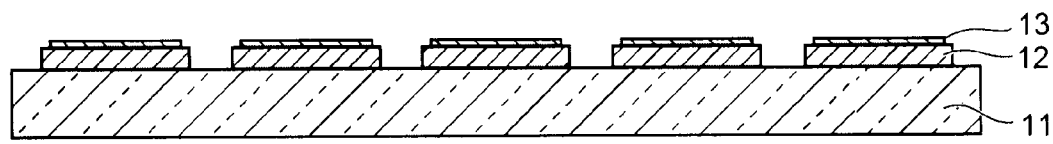

Then, as illustrated in FIG. 13B, a multilayered film 13 is formed on each of the light emitting layers 12 on the substrate 11. First, a Ni/Au film (not illustrated) is formed with thicknesses of 0.1 micrometers/0.1 micrometers on the entire front surface of the light emitting layer 12 as the contact layer of the light emitting layer 12 by sputtering. A metal film (not illustrated) of Ag or Al is formed on this film with a thickness of 0.3 micrometers by sputtering. Thereby, the reflective layer 6 of the optical semiconductor device 1A is formed. Subsequently, a Ni/Au film (not illustrated) is formed with thicknesses of 0.1 micrometers/0.1 micrometers in the electrode portions of the light emitting layer 12 as the electrode material; and a passivation film (not illustrated) of a $SiO_2$ film is formed with a thickness of 0.3 micrometers in a region other than the electrode portions by sputtering. Thereby, the first electrode 7a, the second electrodes 7b, and the insulating layer 9 of the optical semiconductor device 1A are formed. Thus, the multilayered film 13 is formed on each of the light emitting layers 2 on the substrate 11.

Figure 13C:
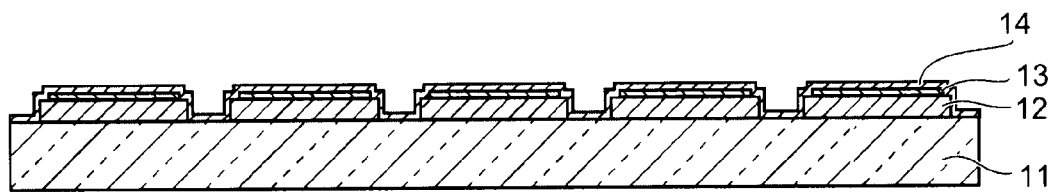

Continuing as illustrated in FIG. 13C, a seed layer 14, which is an electrically conductive film used to form a power supply layer of plating, is formed over the entire surface of the substrate 11 using a physical covering method such as vapor deposition, sputtering, etc. A stacked film such as, for example, Ti/Cu is used as the seed layer 14. Here, the Ti layer is formed to increase the adhesion strength with the resist and the pads. Accordingly, the film thickness thereof may be about 0.1 micrometers. On the other hand, it is favorable for the film thickness of the Cu to be not less than 0.2 micrometers because the Cu contributes mainly to the power supply.

Figure 13D:
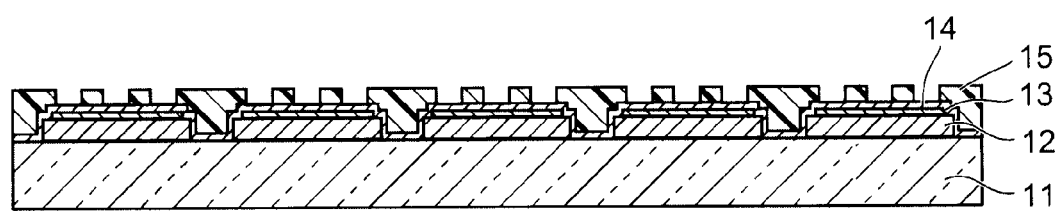

Then, as illustrated in FIG. 13D, a resist layer 15, which is a sacrificial layer in which holes are made at the electrode pad portions which are the portions of the first electrode 7a and the second electrodes 7b, is formed over the entire surface of the substrate 11. It is possible to use a photosensitive liquid resist or dry film resist as the resist. The resist layer 15 is formed on the entire surface of the substrate 11 by first forming an initial resist layer used to form the resist layer 15 and by subsequently making openings by exposing and developing using a light-shielding mask. The resist is baked after the developing if necessary according to the material.

Figure 14A:
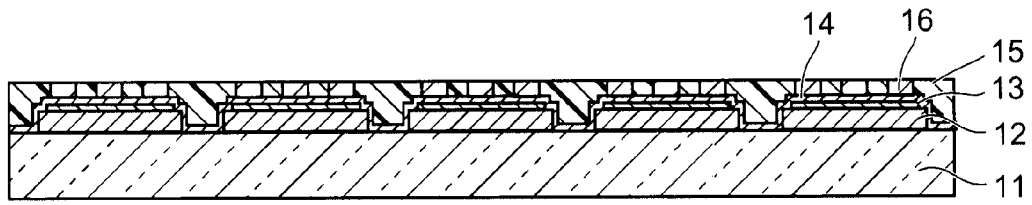
FIGS. 14A to 14D are cross-sectional views of processes, illustrating a method for manufacturing an optical semiconductor device of a ninth embodiment.

Continuing as illustrated in FIG. 14A, a plating layer 16 is formed in the openings of the resist layer 15 using electroplating. Thereby, each of the metal posts 8a and 8b of the optical semiconductor device 1A is formed. When electroplating, for example, the substrate 11 of the wafer is immersed in a plating liquid made of copper sulfate and sulfuric acid; the negative terminal of a direct-current power source is connected to the seed layer 14; the positive terminal of the direct-current power source is connected to a Cu plate used as the anode disposed to oppose the surface to be plated of the substrate 11; a current flows; and the Cu plating starts. Although the thickness of the plating film increases as time elapses, the plating is completed by stopping the flow of current prior to the thickness reaching the thickness of the resist layer 15.

Figure 14B:
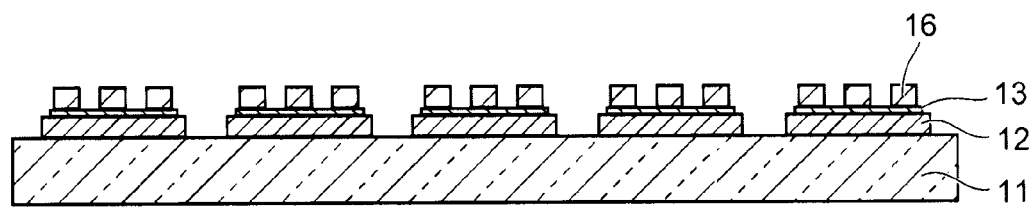

After the plating as illustrated in FIG. 14B, the resist layer 15 is removed by being peeled from the substrate 11. Subsequently, the seed layer 14 is removed by etching using acid cleaning. Thereby, the light emitting layer 12, the multilayered film 13, and the plating layer 16 are exposed.

Figure 14C:
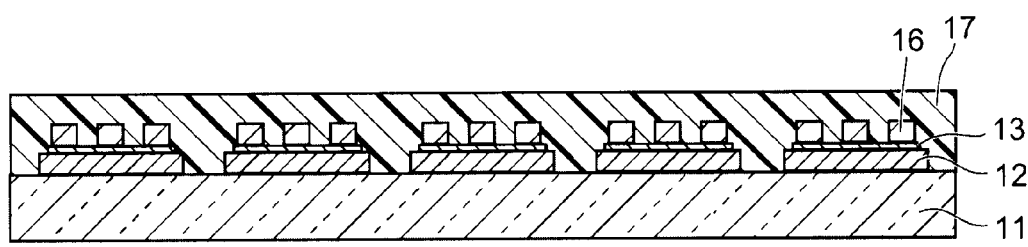

Then, as illustrated in FIG. 14C, a thermosetting resin layer 17 used to form the sealing layer is formed over the entire surface of the substrate 11. First, a thermosetting resin is supplied around the plating layer 16 with a thickness thick enough to bury the plating layer 16 by spin coating; and subsequently, the thermosetting resin layer 17 is cured by heating by being placed in an oven. The resin is cured by being heated at, for example, 150° C. for 2 hours.

Figure 14D:
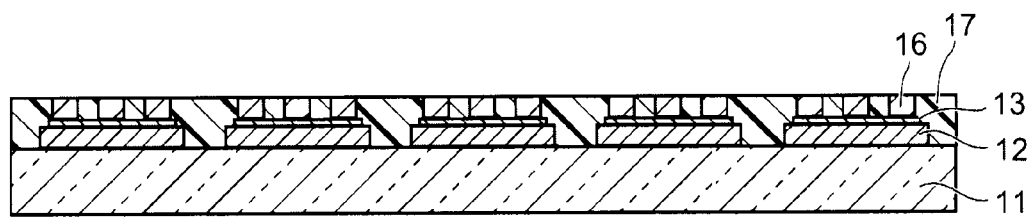

Subsequently, as illustrated in FIG. 14D, the plating layer is exposed by polishing the front surface of the thermosetting resin layer 17. Thereby, the sealing layer 10 of the optical semiconductor device 1A is formed. By using a rotating polishing wheel to polish the thermosetting resin layer 17, it is possible to complete the polishing while ensuring the planarity by rotational polishing. After completing the polishing, drying may be performed if necessary. This polishing process is necessary to expose the end portion of the plating layer 16 after the spin coating because it is difficult (the coating time and cost increase) to coat the thermosetting resin while leaving exposed only the end portion of the plating layer 16 when using spin coating, etc., in the previous process.

Figure 15A:
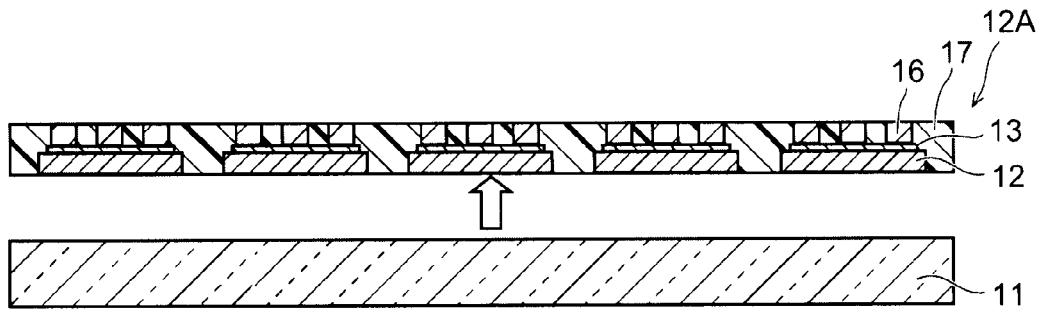
FIGS. 15A to 15D are cross-sectional views of processes, illustrating a method for manufacturing an optical semiconductor device of a ninth embodiment.

Then, as illustrated in FIG. 15A, lift-off of the light emitting layer 12 from the substrate 11 is performed by irradiating a laser between the layers of the substrate 11 and the light emitting layer 12. That is, the light emitting layer 12 is separated and peeled from the substrate 11. Thereby, the light emitting layer 12, the multilayered film 13, the plating layer 16, and a light emitting base member 12A made of the thermosetting resin layer 17 are separated from the substrate 11. The lift-off is performed by irradiating laser light having a wavelength of 355 nm through the substrate 11 between the layers of the light emitting layer 12 and the substrate 11 using a Nd:YAG third harmonic laser. The lift-off is an option and may be omitted.

Although a specific example in which a gallium nitride-based crystal is grown on the substrate 11 of the sapphire wafer and separated from the substrate 11 is illustrated herein, the embodiment is not limited thereto. For example, it is also possible to form the light emitting layer 12 by growing an InGaAlP-based crystal on a substrate of GaAs and removing the GaAs substrate using a method such as etching. Although the light emission obtained from the InGaAlP-based crystal is undesirably absorbed by the GaAs substrate, the light emitted from the InGaAlP-based light emitting layer can be extracted to the outside without being absorbed by the GaAs substrate by the GaAs substrate being thus removed.

Figure 15B:
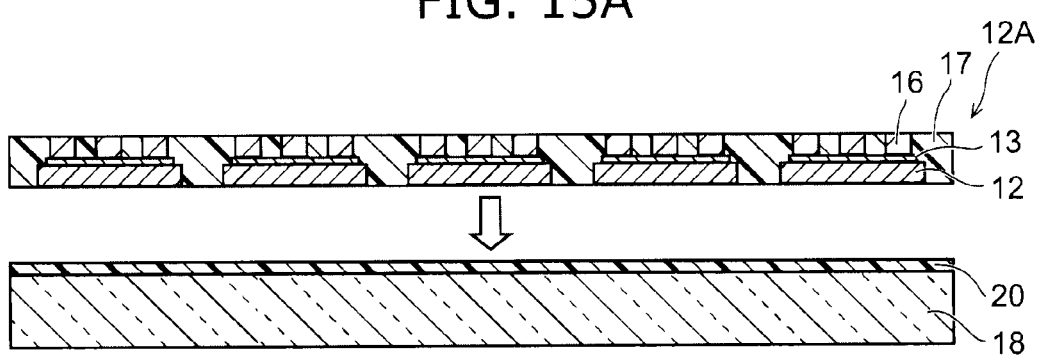

Then, as illustrated in FIG. 15B, the light emitting base member 12A formed by the lift-off is bonded onto a transparent base member 18 such as an optical glass wafer with the light emitting layer 12 toward the transparent base member 18 and with a bonding layer 20 interposed. In a separate process, a silicone resin layer is formed as the bonding layer 20 on the transparent base member 18 made of a transparent inorganic substance. Thus, the transparent layer 5 and the bonding layer 3 of the optical semiconductor device 1A are formed.

Here, the bonding between the transparent base member 18 and the light emitting layer 12 is performed by supplying a silicone resin onto the transparent base member 18 by spraying, subsequently bonding after performing positional alignment, and curing and bonding by placing the light emitting base member 12A and the transparent base member 18 into an oven in the bonded state. The curing of the silicone resin is possible by heating at, for example, 150° C. for 1 hour.

Figure 15C:
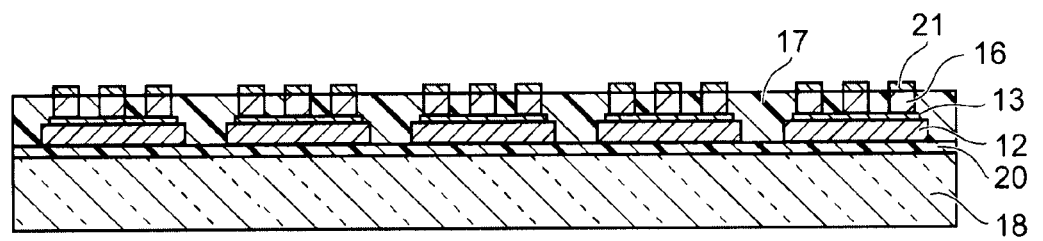

Then, as illustrated in FIG. 15C, a Ni/Au layer 21 is formed on the Cu electrode of the plating layer 16 using electroless plating. Thereby, the metal layers 11a and 11b of the optical semiconductor device 1A are formed. In the electroless plating of the Ni, the Ni layer is formed in a film by, for example, performing degreasing by processing for 3 minutes in a weakly alkaline degreasing liquid, performing water rinse by processing for 1 minute in running water, performing acid rinse, subsequently immersing the wafer in a nickel-phosphorus plating liquid temperature-controlled to 70° C., and subsequently performing water rinse. In the electroless plating of the Au, the plating is performed on the Cu electrode surface by immersing the wafer in an electroless gold plating liquid temperature-controlled to 70° C. and subsequently performing water rinse and drying.

Figure 15D:
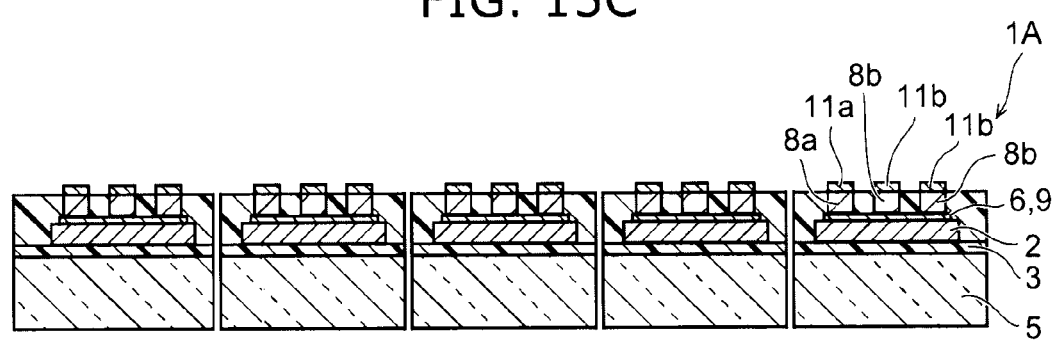

Finally, as illustrated in FIG. 15D, the multiple optical semiconductor devices 1A are cut out by dicing using a dicer; and the optical semiconductor device 1A according to the first embodiment is obtained. The same processes as those described above may be used as the manufacturing processes of the optical semiconductor device 1H according to the eighth embodiment; and the optical semiconductor device 1H according to the eighth embodiment can be obtained by modifying the opening size and the configuration of the resist layer 15.

On the other hand, the optical semiconductor device 1C according to the third embodiment can be obtained by using a fluorescent base member to form the fluorescent layer 4 instead of the transparent base member 18 of the processes illustrated in FIGS. 15B and 15C, bonding the fluorescent base member to the light emitting base member 12A by the bonding layer 20, and performing the dicing as illustrated in FIG. 15D.

According to the embodiment as described above, the optical semiconductor devices 1A and 1C according to the first and third embodiments can be manufactured; and as a result, effects similar to those of the first and third embodiments can be obtained. The optical semiconductor device 1H according to the eighth embodiment can be manufactured by modifying the opening size and the configuration of the resist layer 15; and as a result, effects similar to those of the eighth embodiment can be obtained. Because it is possible to manufacture many optical semiconductor devices 1A, 1C, and 1H by performing the manufacturing processes once, mass production of the optical semiconductor devices 1A, 1C, and 1H can be realized; and as a result, the costs of the optical semiconductor devices 1A, 1C, and 1H can be reduced.

Here, the layer made of the resin and metal is flexible, and the metal is formed by plating at near room temperature. Hence, the residual stress occurring with respect to the substrate 11 is relatively low. In the conventional technique for separating the light emitting layer 12 from the substrate 11 at wafer level, for example, it is bonded to a silicon substrate with a metal layer formed thereon using Au—Sn solder at a high temperature of 300° C. or more, and then the light emitting layer 12 made of GaN is separated by laser irradiation. However, in this conventional technique, the substrate 11 and the silicon substrate being different in thermal expansion coefficient are both rigid, and are bonded together at high temperature. Hence, a high residual stress remains between these substrates. Consequently, when the separation is started by laser irradiation, the residual stress is locally relieved from the separated portion and unfortunately causes cracks in the thin, brittle light emitting layer 12. In contrast, in this embodiment, the residual stress is low, and the light emitting layer 12 is separated in the state of being fixed to a flexible support.

Hence, the device can be manufactured at high yield without trouble such as cracking in the light emitting layer 12.

Tenth Embodiment

A tenth embodiment of the invention will now be described with reference to FIGS. 16A to 16C. The embodiment is a method for manufacturing an optical semiconductor device 1B according to the second embodiment. Portions described in regard to the embodiment similar to portions described in regard to the first to ninth embodiments are marked with like reference numerals, and a description is omitted.

Figure 16A:
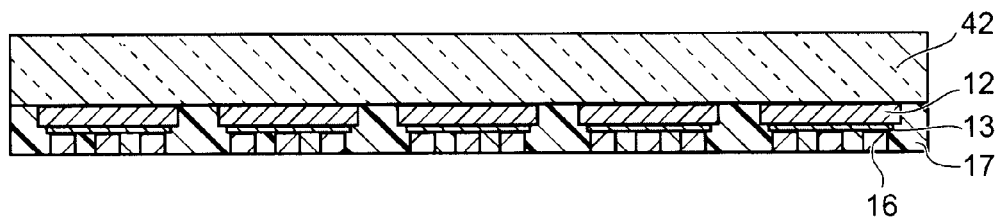
FIGS. 16A to 16C are cross-sectional views of processes, illustrating a portion of a method for manufacturing an optical semiconductor device of a tenth embodiment.
Figure 16B:
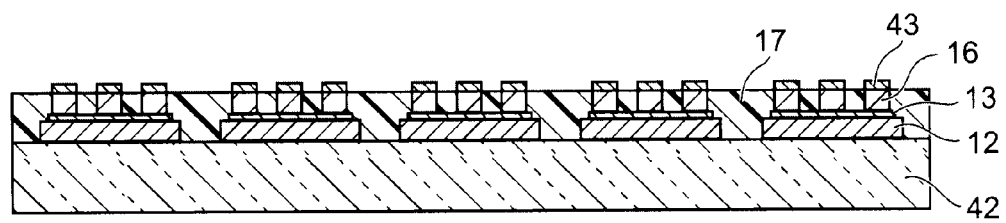
Figure 16C:
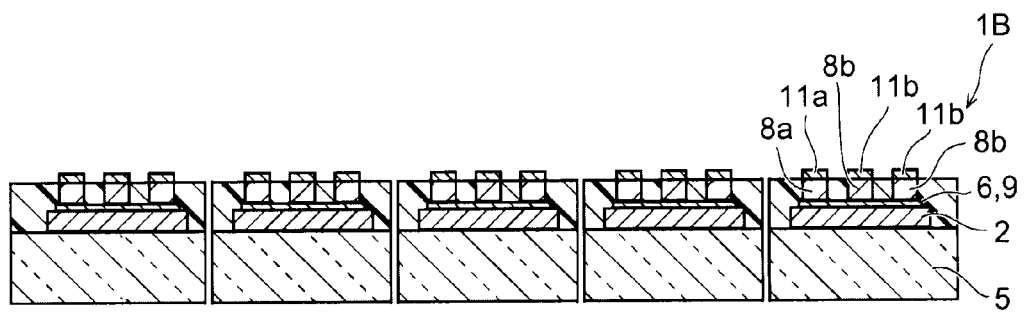

FIGS. 16A to 16C are cross-sectional views of processes, illustrating a portion of the method for manufacturing the optical semiconductor device of the embodiment.

The processes up to the process illustrated in FIG. 16A may be similar to those described above in regard to FIG. 13A to FIG. 15A.

As described above in regard to FIG. 15A, lift-off of the light emitting base member 12A from the substrate 11 is performed by irradiating a laser between the layers of the substrate 11 and the light emitting layer 12.

Then, as illustrated in FIG. 16A, a transparent base member 42 is formed on the surface on the light emitting layer 12 side of the light emitting base member 12A formed by the lift-off. The transparent base member 42 is formed, for example, by coating liquid glass using a method such as spin coating and by curing. Other than spin coating, it is also possible to supply the liquid glass by spraying; and the supply method is not limited. It is possible to perform the curing of the glass layer by heating at, for example, 200° C. for 1 hour. Other than liquid glass, the film formation material of the transparent layer 42 may be appropriately selected according to the application.

Or, a material such as silicon oxide may be deposited using a method such as sputtering, CVD (Chemical Vapor Deposition), etc.

Alternatively, a resin material such as a silicone resin may be formed by being coated onto the light emitting base member 12A by spin coating, etc., and subsequently being placed in an oven and cured using UV (ultraviolet). The silicone resin may include a substance that cures when heated at, for example, 150° C. for 1 hour. To form the transparent base member 42 in a film with a uniform thickness, the silicone resin is supplied onto the light emitting base member 12A; subsequently, a spacer is formed; a fluorinated jig having high peelability is bonded to the front surface; and curing is performed. Thereby, it is possible to form the silicone resin film with a uniform thickness by suppressing the curve of the front surface due to the surface tension of the resin.

Then, as illustrated in FIG. 16B, a Ni/Au layer 43 is formed on the Cu electrode of the plating layer 16 using electroless plating. Thereby, the metal layers 11a and 11b of the optical semiconductor device 1B are formed. In the electroless plating of the Ni and the electroless plating of the Au, plating is performed similarly to the formation process of the Ni/Au layer 21 according to the ninth embodiment.

Finally, as illustrated in FIG. 16C, the multiple optical semiconductor devices 1B are cut out by dicing using a dicer; and the optical semiconductor device 1B according to the second embodiment is obtained.

According to the embodiment as described above, the optical semiconductor device 1B according to the second embodiment can be manufactured; and as a result, effects similar to those of the second embodiment can be obtained. Because it is possible to manufacture many optical semiconductor devices 1B by performing the manufacturing processes once, mass production of the optical semiconductor device 1B can be realized; and as a result, the costs of the optical semiconductor device 1B can be reduced.

Eleventh Embodiment

An eleventh embodiment of the invention will now be described with reference to FIGS. 17A to 17C. In the embodiment, a method for manufacturing an optical semiconductor device 1D according to the fourth embodiment will be described. Portions of the embodiment similar to portions described in regard to the first to tenth embodiments are marked with like reference numerals, and a description is omitted.

Figure 17A:
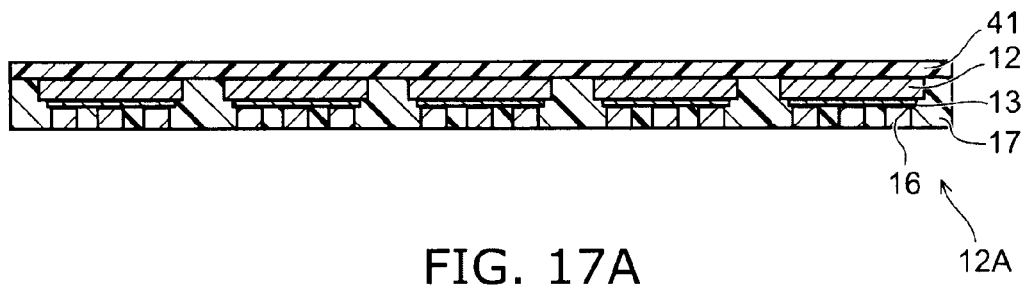
FIGS. 17A to 17C are cross-sectional views of processes, illustrating a portion of a method for manufacturing an optical semiconductor device of an eleventh embodiment.
Figure 17B:
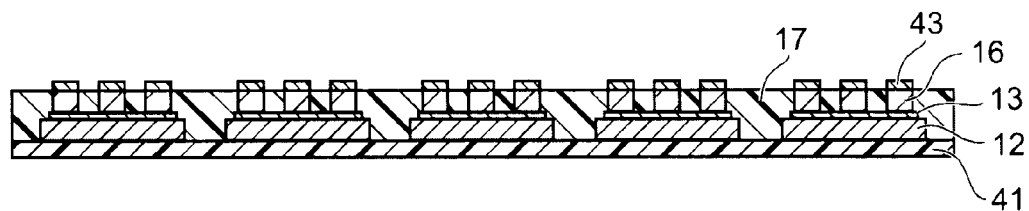
Figure 17C:
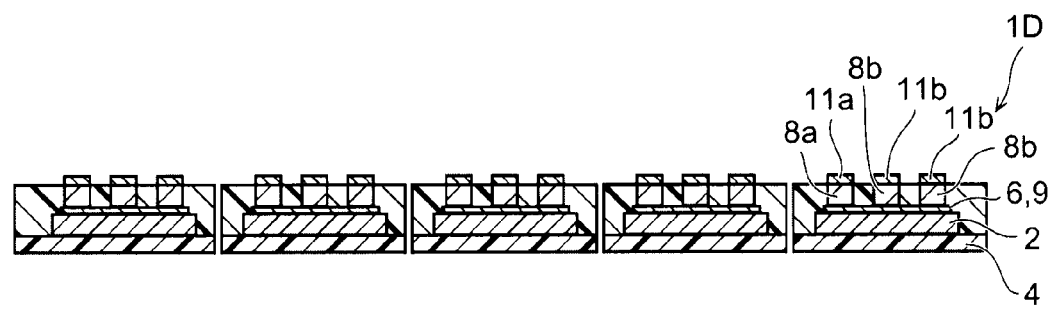

FIGS. 17A to 17C are cross-sectional views of processes, illustrating a portion of the method for manufacturing the optical semiconductor device of the embodiment.

The manufacturing processes according to the embodiment are similar to the processes of the ninth embodiment from the film formation process of the light emitting layer 12 illustrated in FIG. 13A up to the lift-off process illustrated in FIG. 15A.

After the lift-off process, as illustrated in FIG. 17A, a fluorescent layer 41 is formed on the surface of the light emitting base member 12A on the light emitting layer 12 side. The fluorescent layer 41 is formed of a silicone resin, liquid glass, etc., into which a fluorescer particle is mixed. Thereby, the fluorescent layer 4 of the optical semiconductor device 1D is formed.

Here, the fluorescer particle and the silicone resin (or the liquid glass, etc.) may be formed by, for example, being mixed uniformly in a planetary mixing apparatus, subsequently being supplied onto the light emitting base member 12A by spin coating, and subsequently being placed into an oven and cured. A substance that cures when heated at, for example, 150° C. for 1 hour may be used as the silicone resin. To form the fluorescent layer 4 in a film with a uniform thickness, a silicone resin is supplied onto the light emitting base member 12A; subsequently, a spacer is formed; a fluorinated jig having high peelability is bonded to the front surface; and curing is performed. Thereby, it is possible to form the silicone resin film with a uniform thickness by suppressing the curve of the front surface due to the surface tension of the resin.

Or, it is also possible to form the fluorescent layer 41 on the light emitting base member 12A using sputtering. At this time, it is also possible to stack the fluorescent layer 41 by performing sputtering multiple times; and the optical semiconductor device 1D according to the fourth embodiment can be manufactured. It is also possible to form the fluorescent layer 41 in a film using a CVD apparatus.

It is possible to form a fluorescent layer 41 containing a fluorescer having a high concentration by depositing the material of the fluorescer using sputtering or CVD.

Then, as illustrated in FIG. 17B, the Ni/Au layer 43 is formed on the Cu electrode of the plating layer 16 using electroless plating. Thereby, the metal layers 11a and 11b of the optical semiconductor device 1D are formed. In the electroless plating of the Ni and the electroless plating of the Au, plating is performed similarly to the formation process of the Ni/Au layer 21 according to the ninth embodiment.

Finally, as illustrated in FIG. 17C, the multiple optical semiconductor devices 1D are cut out by dicing using a dicer; and the optical semiconductor device 1D according to the fourth embodiment is obtained.

According to the embodiment as described above, the optical semiconductor device 1D according to the fourth embodiment can be manufactured; and as a result, effects similar to those of the fourth embodiment can be obtained. Because it is possible to manufacture many optical semiconductor devices 1D by performing the manufacturing processes once, mass production of the optical semiconductor device 1D can be realized; and as a result, the costs of the optical semiconductor device 1D can be reduced.

Twelfth Embodiment

A twelfth embodiment of the invention will now be described with reference to FIGS. 18A to 18D. The embodiment is a method for manufacturing an optical semiconductor device 1E according to the fifth embodiment. Portions described in regard to the embodiment similar to portions described in regard to the first to eleventh embodiments are marked with like reference numerals, and a description is omitted.

FIGS. 18A to 18D are cross-sectional views of processes, illustrating a portion of the method for manufacturing the optical semiconductor device of the embodiment.

Figure 18A:
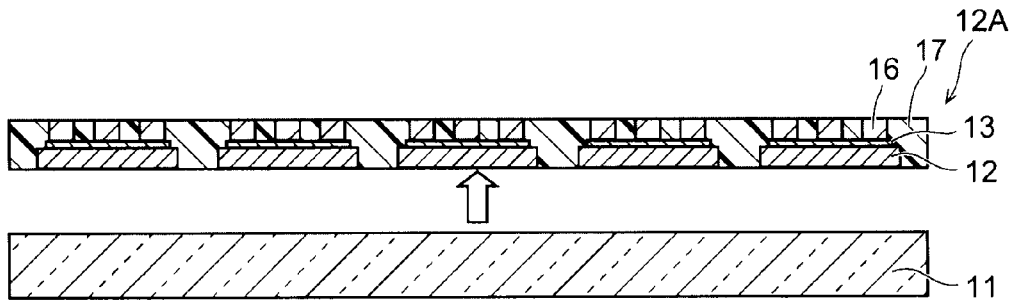
FIGS. 18A to 18D are cross-sectional views of processes, illustrating a portion of a method for manufacturing an optical semiconductor device of a twelfth embodiment.

The processes up to the process illustrated in FIG. 18A may be similar to those described above in regard to FIG. 13A to FIG. 15D.

Then, as illustrated in FIG. 18A, lift-off of the light emitting layer 12 from the substrate 11 is performed by irradiating a laser between the layers of the substrate 11 and the light emitting layer 12.

Figure 18B:
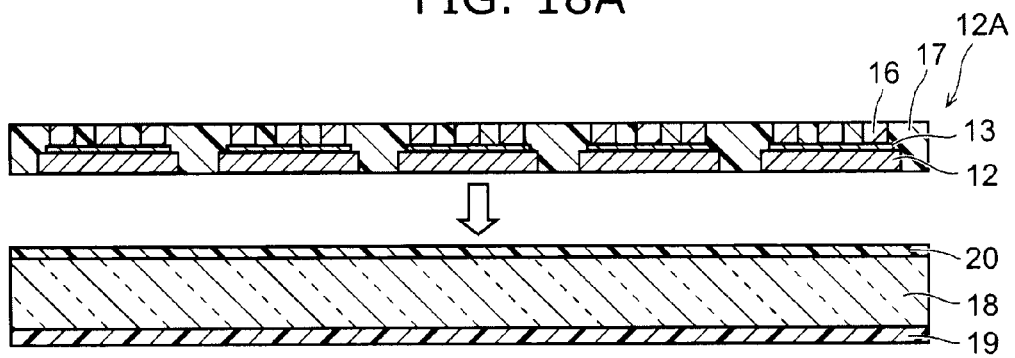

Continuing as illustrated in FIG. 18B, the transparent base member 18, which is an optical glass wafer on which a fluorescent layer 19 is provided, etc., is bonded to the light emitting layer 2 of the light emitting base member 12A formed by the lift-off with the bonding layer 20 interposed. In a separate process, a fluorescent base member is formed, that is, a silicone resin layer into which a fluorescer particle is mixed, etc., are formed as the fluorescent layer 19 on the transparent base member 18 made of a transparent inorganic substance or organic substance. Then, a silicone resin layer is formed on the transparent base member 18 as the bonding layer 20. Thus, the fluorescent layer 4, the transparent layer 5, and the bonding layer 3 of the optical semiconductor device 1E are formed. For example, the process of forming the transparent layer 5 (the process of adhering the transparent layer 5) may include the process of stacking the fluorescent layer 19 on the transparent layer 5.

Here, the fluorescer particle and the silicone resin may be formed by, for example, being mixed uniformly in a planetary mixing apparatus, subsequently being supplied onto the transparent base member 18 by spin coating, and subsequently being placed into an oven and cured. A substance that cures when heated at, for example, 150° C. for 1 hour may be used as the silicone resin. To form the fluorescent layer 4 in a film with a uniform thickness, the silicone resin is supplied onto the transparent base member 18; subsequently, a spacer is formed; a fluorinated jig having high peelability is bonded to the front surface; and curing is performed. Thereby, it is possible to form the silicone resin film with a uniform thickness by suppressing the curve of the front surface due to the surface tension of the resin.

The bonding of the transparent base member 18, on which the fluorescent layer 19 is formed, and the light emitting layer 12 may be performed by supplying a silicone resin onto the transparent base member 18 by spraying, subsequently bonding after performing positional alignment, and performing curing and bonding by placing the light emitting base member 12A and the transparent base member 18 into an oven in the bonded state. It is possible to cure the silicone resin by heating at, for example, 150° C. for 1 hour.

Figure 18C:
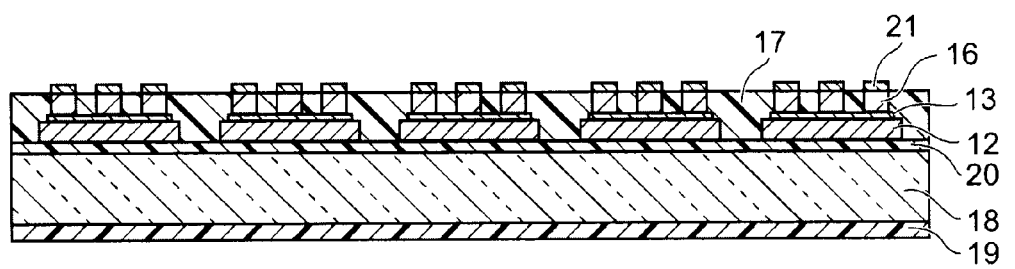

Then, as illustrated in FIG. 18C, the Ni/Au layer 21 is formed. Thereby, the metal layers 11a and 11b of the optical semiconductor device 1A are formed.

Figure 18D:
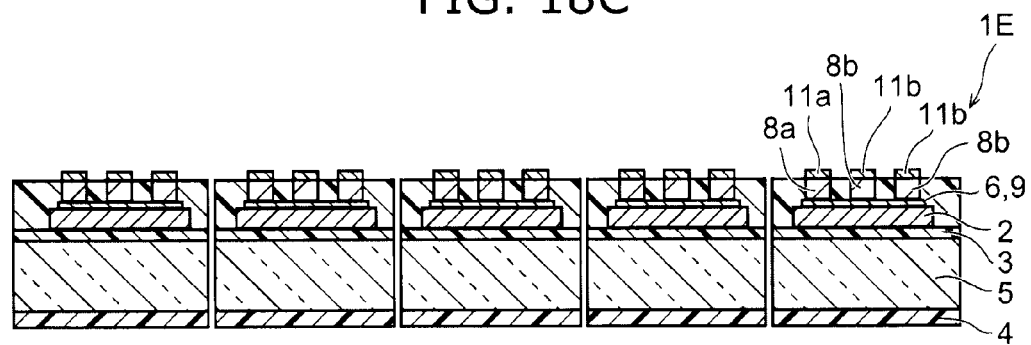

Finally, as illustrated in FIG. 18D, the multiple optical semiconductor devices 1E are cut out by dicing using a dicer; and the optical semiconductor device 1E according to the fifth embodiment is obtained.

According to the embodiment as described above, the optical semiconductor device 1E according to the fifth embodiment can be manufactured; and as a result, effects similar to those of the fifth embodiment can be obtained. The optical semiconductor device 1H according to the eighth embodiment can be manufactured by modifying the opening size and the configuration of the resist layer 15; and as a result, effects similar to those of the eighth embodiment can be obtained. Because it is possible to manufacture many optical semiconductor devices 1E and 1H by performing the manufacturing processes once, mass production of the optical semiconductor devices 1E and 1H can be realized; and as a result, the costs of the optical semiconductor devices 1E and 1H can be reduced.

Thirteenth Embodiment

A thirteenth embodiment of the invention will now be described with reference to FIGS. 19A to 19D. The embodiment is a method for manufacturing an optical semiconductor device 1F according to the sixth embodiment. Portions described in regard to the embodiment similar to portions described in regard to the first to twelfth embodiments are marked with like reference numerals, and a description is omitted.

FIGS. 19A to 19D are cross-sectional views of processes, illustrating a portion of the method for manufacturing the optical semiconductor device of the embodiment.

Figure 19A:
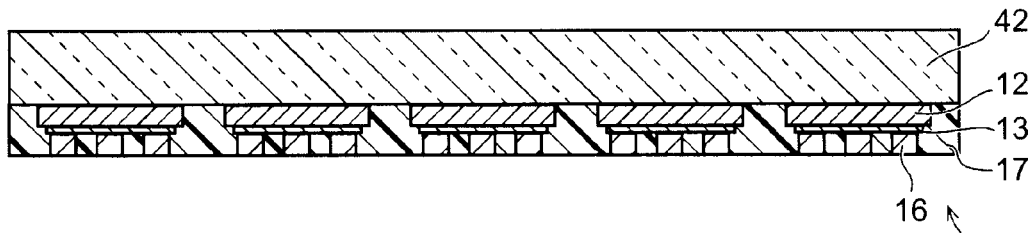
FIGS. 19A to 19D are cross-sectional views of processes, illustrating a portion of a method for manufacturing an optical semiconductor device of a thirteenth embodiment.

The processes up to the process illustrated in FIG. 19A may be similar to those described above in regard to FIG. 13A to FIG. 15A.

Then, as described above in regard to FIG. 15A, lift-off of the light emitting base member 12A from the substrate 11 is performed by irradiating a laser between the layers of the substrate 11 and the light emitting layer 12.

Continuing as illustrated in FIG. 19A, the transparent base member 42 is formed on the surface on the light emitting layer 12 side of the light emitting base member 12A formed by the lift-off. The transparent base member 42 is formed, for example, by coating liquid glass using a method such as spin coating and by curing. Other than spin coating, it is also possible to supply the liquid glass by spraying; and the supply method is not limited. It is possible to perform the curing of the glass layer by heating at, for example, 200° C. for 1 hour. Other than liquid glass, the film formation material of the transparent layer 42 may be appropriately selected according to the application.

Or, a material such as silicon oxide may be deposited using a method such as sputtering, CVD (Chemical Vapor Deposition), etc.

Alternatively, a resin material such as a silicone resin may be formed by being coated onto the light emitting base member 12A by spin coating, etc., and subsequently being placed in an oven and cured using UV (ultraviolet). A substance that cures when heated at, for example, 150° C. for 1 hour may be used as the silicone resin. To form the transparent base member 42 in a film with a uniform thickness, the silicone resin is supplied onto the light emitting base member 12A; subsequently, a spacer is formed; a fluorinated jig having high peelability is bonded to the front surface; and curing is performed. Thereby, it is possible to form the silicone resin film with a uniform thickness by suppressing the curve of the front surface due to the surface tension of the resin.

Figure 19B:
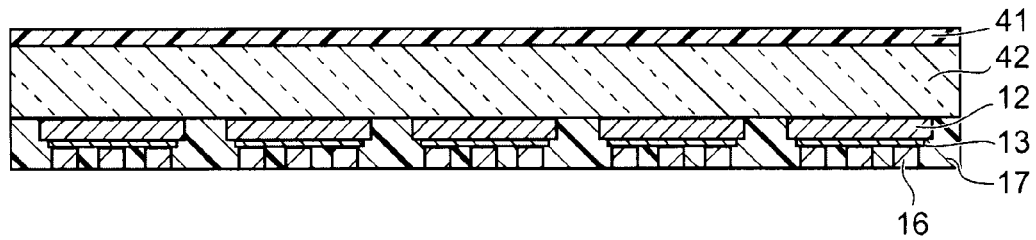

Then, as illustrated in FIG. 19B, the fluorescent layer 41 is formed on the transparent base member 42. The fluorescent layer 41 is formed of a silicone resin, liquid glass, etc., into which a fluorescer particle is mixed. Thereby, the fluorescent layer 4 of the optical semiconductor device 1F is formed.

Here, the fluorescer particle and the silicone resin (or the liquid glass, etc.) may be formed by, for example, being mixed uniformly in a planetary mixing apparatus, subsequently being supplied onto the transparent base member 42 by spin coating, and subsequently being placed in an oven and cured. A substance that cures when heated at, for example, 150° C. for 1 hour may be used as the silicone resin. To form the fluorescent layer 4 in a film with a uniform thickness, the silicone resin is supplied onto the transparent base member 42; subsequently, a spacer is formed; a fluorinated jig having high peelability is bonded to the front surface; and curing is performed. Thereby, it is possible to form the silicone resin film with a uniform thickness by suppressing the curve of the front surface due to the surface tension of the resin.

Or, it is also possible to form the fluorescent layer 41 on the transparent base member 42 using sputtering. At this time, it is also possible to stack the fluorescent layer 41 by performing sputtering multiple times. The fluorescent layer 41 also may be formed using a CVD apparatus. It is possible to form a fluorescent layer 41 containing a fluorescer having a high concentration by depositing the material of the fluorescer using sputtering or CVD.

Figure 19C:
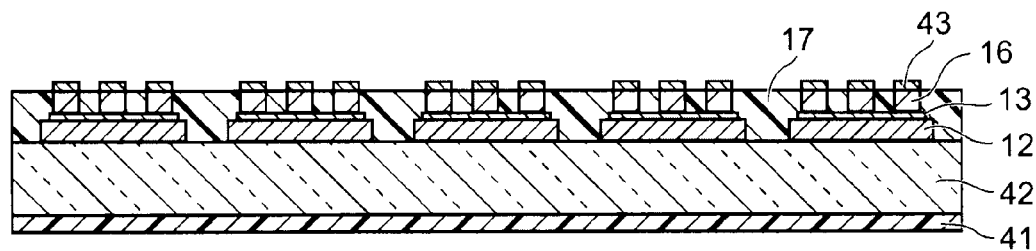

Then, as illustrated in FIG. 19C, the Ni/Au layer 43 is formed on the Cu electrode of the plating layer 16 using electroless plating. Thereby, the metal layers 11a and 11b of the optical semiconductor device 1F are formed. In the electroless plating of the Ni and the electroless plating of the Au, plating is performed similarly to the formation process of the Ni/Au layer 21 according to the ninth embodiment.

Figure 19D:
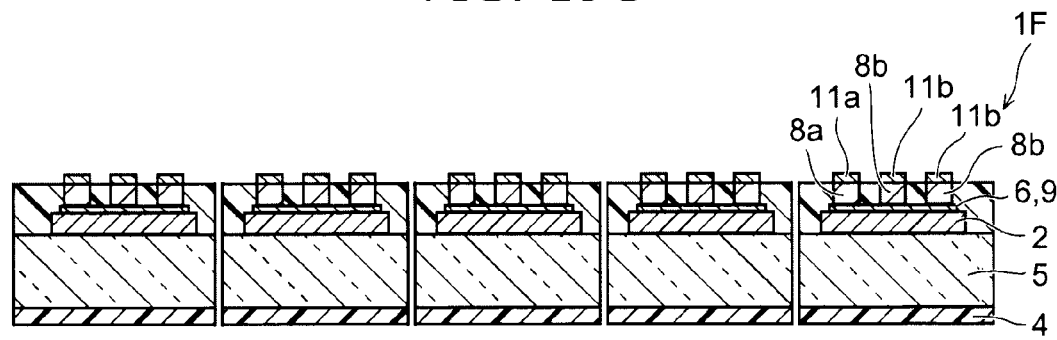

Finally, as illustrated in FIG. 19D, the multiple optical semiconductor devices 1F are cut out by dicing using a dicer; and the optical semiconductor device 1F according to the sixth embodiment is obtained.

According to the embodiment as described above, the optical semiconductor device 1F according to the sixth embodiment can be manufactured; and as a result, effects similar to those of the sixth embodiment can be obtained. Because it is possible to manufacture many optical semiconductor devices 1F by performing the manufacturing processes once, mass production of the optical semiconductor device 1F can be realized; and as a result, the costs of the optical semiconductor device 1F can be reduced.

Fourteenth Embodiment

A fourteenth embodiment of the invention will now be described with reference to FIGS. 20A to 20D. In the embodiment, a method for manufacturing the optical semiconductor device 1G according to the seventh embodiment will be described. Portions of the fourteenth embodiment similar to portions described in regard to the first to thirteenth embodiments are marked with like reference numerals, and a description is omitted.

FIGS. 20A to 20D are cross-sectional views of processes, illustrating a portion of the method for manufacturing the optical semiconductor device of the embodiment.

The manufacturing processes according to the embodiment are similar to the processes of the ninth embodiment from the film formation process of the light emitting layer 12 illustrated in FIG. 13A to the bonding process illustrated in FIG. 15B.

Figure 20A:
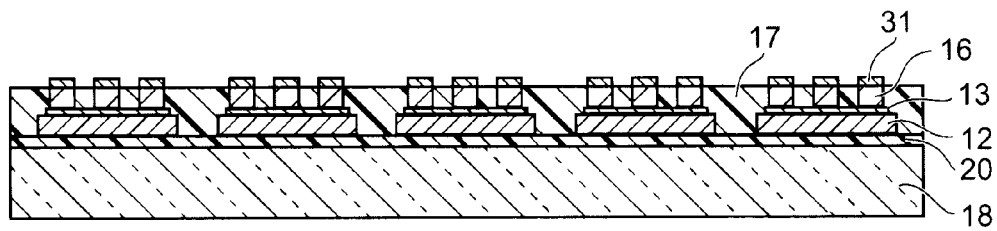
FIGS. 20A to 20D are cross-sectional views of processes, illustrating a portion of a method for manufacturing an optical semiconductor device of a fourteenth embodiment.

After the bonding process, as illustrated in FIG. 20A, a contact layer 31 such as a Ni/Au layer is formed on the Cu electrode of the plating layer 16 using electroless plating. In the electroless plating of the Ni and the electroless plating of the Au, plating is performed similarly to the formation process of the Ni/Au layer 21 according to the sixth embodiment.

Figure 20B:
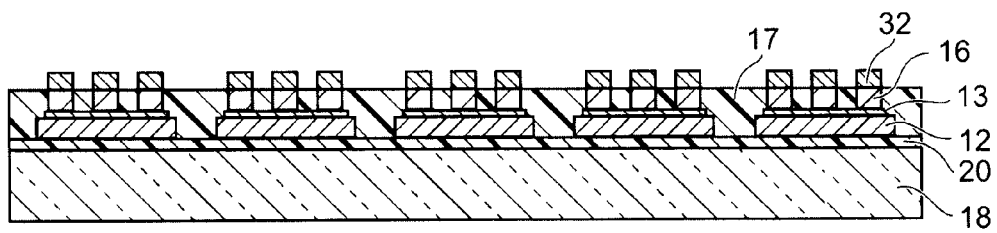

Then, as illustrated in FIG. 20B, a solder paste 32 of Sn-3.0Ag-0.5Cu is coated onto the contact layer 31 using printing. The coating method of the solder paste 32 is not limited to printing.

Figure 20C:
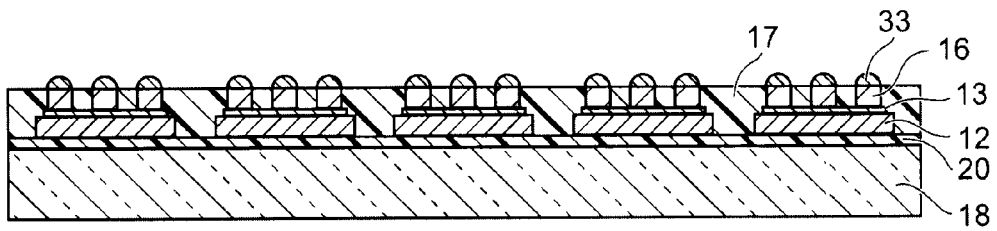

Subsequently, as illustrated in FIG. 20C, a solder bump 33 is formed on the Cu electrode of the plating layer 16 by remelting the solder by passing the transparent base member 18 of the wafer through a reflow oven and cleaning the flux residue. Thereby, the metal layers 11a and 11b of the optical semiconductor device 1B are formed.

Figure 20D:
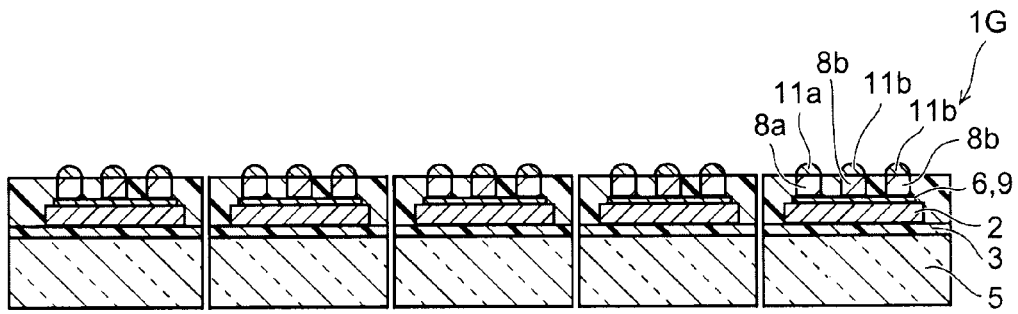

Finally, as illustrated in FIG. 20D, the multiple optical semiconductor devices 1G are cut out by dicing using a dicer; and the optical semiconductor device 1G according to the seventh embodiment is obtained.

According to the embodiment as described above, the optical semiconductor device 1G according to the seventh embodiment can be manufactured; and as a result, effects similar to those of the seventh embodiment can be obtained. Because it is possible to manufacture many optical semiconductor devices 1G by performing the manufacturing processes once, mass production of the optical semiconductor device 1G can be realized; and as a result, the costs of the optical semiconductor device 1G can be reduced.

Other Embodiments

The invention is not limited to the embodiments described above; and various modifications are possible without departing from the spirit of the invention. For example, several components may be deleted from all of the components illustrated in the embodiments described above. Further, components of different embodiments may be combined as appropriate. Although various numbers are illustrated in the embodiments described above, such numbers are examples and are not limited thereto.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An optical semiconductor device, comprising:
   a light emitting layer including a first major surface, a second major surface, a first electrode, and a second electrode, the second major surface being a surface opposite to the first major surface, the first electrode and the second electrode being formed on the second major surface, the light emitting layer being configured to emit a first light;
   a transparent layer provided on the first major surface, the transparent layer being transparent with respect to the first light;
   a fluorescent layer provided on the transparent layer, the fluorescent layer being configured to absorb a part of the first light and to emit a second light having a wavelength different from a wavelength of the first light;
   a first metal post provided on the first electrode;
   a second metal post provided on the second electrode; and
   a sealing layer provided on the second major surface, the sealing layer being configured to cover at least a part of a side surface of the light emitting layer and to seal a side face of the first metal post and a side face of the second metal post, the sealing layer being light-shielding with respect to the first light,
   at least a part of a side face of the transparent layer being not covered by the fluorescent layer and not covered by the sealing layer.

2. The device according to claim 1, wherein the light emitting layer includes a semiconductor stacked body separated from a substrate after being epitaxially grown on the substrate.

3. The device according to claim 1, wherein a part of the first light is configured to be guided through the transparent layer and the part of the first light guided through the transparent layer is configured to be extracted to outside.

4. The device according to claim 1, wherein a refractive index of the transparent layer is not less than 1 and not more than 2.

5. The device according to claim 1, wherein the fluorescent layer contains two types of fluorescer particles differing at least in composition.

6. The device according to claim 1, wherein the fluorescent layer includes two types of fluorescent films stacked with each other, the two types of fluorescent films differing at least in composition.

7. The device according to claim 1, further comprising a bonding layer provided between the light emitting layer and the transparent layer, the bonding layer being configured to bond the light emitting layer to the transparent layer.

8. The device according to claim 1, wherein the transparent layer is a lens.

9. The device according to claim 1, further comprising:
   a first metal layer provided on an end portion of the first metal post not covered by the sealing layer; and
   a second metal layer provided on an end portion of the second metal post not covered by the sealing layer,
   the first metal layer and the second metal layer being solder bumps.

10. The device according to claim 1, wherein the fluorescent layer juts outside the light emitting layer when viewed in plan.

11. The device according to claim 1, wherein the light emitting layer further includes
   a first semiconductor layer provided on a side of the first major surface of the light emitting layer,
   a second semiconductor layer provided on a side of the second major surface of the light emitting layer, and
   an active layer provided between the first semiconductor layer and the second semiconductor layer, and
   the first semiconductor layer is connected with the first electrode, and the second semiconductor layer is connected with the second electrode.

12. The device according to claim 1, wherein a light emitted from the side face of the transparent layer and a part of the second light which is emitted from an end portion of the fluorescent layer are mixed.

13. The device according to claim 1, wherein the sealing layer is formed of a thermosetting resin.

14. The device according to claim 8, wherein the lens is one of a convex lens, a concave lens and a Fresnel lens.

15. The device according to claim 11, further comprising an insulating layer,
   at least a part of the insulating layer being provided at a position between the sealing layer and a side face of the second semiconductor layer and provided at a position between the sealing layer and a side face of the active layer.

16. The device according to claim 7, wherein the bonding layer includes at least one of a silicone resin, an epoxy resin and an urethane resin.

17. The device according to claim 7, wherein the bonding layer includes a material same as a material included in the fluorescent layer.

18. A method for manufacturing an optical semiconductor device, comprising:
forming a light emitting layer including a semiconductor stacked body, a plurality of first electrodes and a plurality of second electrodes, the semiconductor stacked body including a plurality of semiconductor layers, the semiconductor stacked body having a first major surface and a second major surface opposite to the first major surface, each of the first electrodes being provided on a portion of each of the semiconductor layers on the second major surface, each of the second electrodes being provided on other portion of each of the semiconductor layers on the second major surface, the semiconductor stacked body being separated from a substrate after being epitaxially grown on the substrate, the light emitting layer being configured to emit a first light;
forming a first metal post on each of the first electrodes and a second metal post on each of the second electrodes;
forming a sealing layer on the second major surface to cover at least a part of a side surface of the light emitting layer and to seal a side face of the first metal post and a side face of the second metal post, the sealing layer being light-shielding with respect to the first light;
forming a transparent layer on the first major surface, the transparent layer being transparent to the first light, at least a part of a side face of the transparent layer being not covered by the sealing layer; and
forming a fluorescent layer on the transparent layer, the fluorescent layer being configured to absorb a part of the first light and to emit a second light having a wavelength different from a wavelength of the first light, at least the part of the side face of the transparent layer being not covered by the fluorescent layer; and
performing singulation for each of sets of each of the first electrodes and each of the second electrodes.

19. The method according to claim 18, further comprising forming a bonding layer between the light emitting layer and the transparent layer to bond the light emitting layer to the transparent layer.

20. An optical semiconductor device, comprising:
a light emitting layer including a first major surface, a second major surface, a first electrode, and a second electrode, the second major surface being a surface opposite to the first major surface, the first electrode and the second electrode being formed on the second major surface, the light emitting layer being configured to emit a first light;
a bonding layer provided on the first major surface, the bonding layer being transparent with respect to the first light;
a fluorescent layer provided on the bonding layer, the fluorescent layer being configured to absorb a part of the first light and to emit a second light having a wavelength different from a wavelength of the first light;
a first metal post provided on the first electrode;
a second metal post provided on the second electrode; and
a sealing layer provided on the second major surface, the sealing layer being configured to cover at least a part of a side surface of the light emitting layer and seal a side face of the first metal post and a side face of the second metal post, the sealing layer being light-shielding with respect to the first light,
at least a part of a side face of the bonding layer being not covered by the fluorescent layer and not covered by the sealing layer.

21. The device according to claim 20, wherein the light emitting layer includes a semiconductor stacked body separated from a substrate after being epitaxially grown on the substrate.

22. The device according to claim 20, wherein a part of the first light is configured to be guided through the bonding layer and the part of the first light guided through the bonding layer is configured to be extracted to outside.

23. The device according to claim 20, wherein the fluorescent layer contains two types of fluorescer particles differing at least in composition.

24. The device according to claim 20, wherein the fluorescent layer includes two types of fluorescent films stacked with each other, the two types of fluorescent films differing at least in composition.

25. The device according to claim 20, further comprising a transparent layer provided between the bonding layer and the fluorescent layer.

26. The device according to claim 20, further comprising:
a first metal layer provided on an end portion of the first metal post not covered with the sealing layer; and
a second metal layer provided on an end portion of the second metal post not covered with the sealing layer,
the first metal layer and the second metal layer being solder bumps.

27. The device according to claim 20, wherein the fluorescent layer juts outside the light emitting layer when viewed in plan.

28. The device according to claim 20, wherein the light emitting layer further includes:
a first semiconductor layer provided on a side of the first major surface of the light emitting layer,
a second semiconductor layer provided on a side of the second major surface of the light emitting layer, and
an active layer provided between the first semiconductor layer and the second semiconductor layer, and
the first semiconductor layer is connected with the first electrode, and the second semiconductor layer is connected with the second electrode.

29. The device according to claim 20, wherein the bonding layer includes at least one of a silicone resin, an epoxy resin and an urethane resin.

30. The device according to claim 20, wherein a light emitted from the side face of the bonding layer and a part of the second light which is emitted from an end portion of the fluorescent layer are mixed.

31. The device according to claim 20, wherein the bonding layer includes a material same as a material included in the fluorescent layer.

32. The device according to claim 20, wherein the sealing layer is formed of a thermosetting resin.

33. The device according to claim 25, wherein a refractive index of the transparent layer is not less than 1 and not more than 2.

34. The device according to claim 25, wherein the transparent layer is a lens.

35. The device according to claim 34, wherein the lens is one of a convex lens, a concave lens and a Fresnel lens.

36. The device according to claim 28, further comprising a insulating layer, at least a part of the insulating layer being provided at a position between the sealing layer and a side face of the second semiconductor layer and provided at a position between the sealing layer and a side face of the active layer.

37. A method for manufacturing an optical semiconductor device, comprising:
   forming a light emitting layer including a semiconductor stacked body, a plurality of first electrodes and a plurality of second electrodes, the semiconductor stacked body including a plurality of semiconductor layers, the semiconductor stacked body having a first major surface and a second major surface opposite to the first major surface, each of the first electrodes being provided on a portion of each of the semiconductor layers on the second major surface, each of the second electrodes being provided on other portion of each of the semiconductor layers on the second major surface, the semiconductor stacked body being separated from a substrate after being epitaxially grown on the substrate, the light emitting layer being configured to emit a first light;
   forming a first metal post on each of the first electrodes and a second metal post on each of the second electrodes;
   forming a sealing layer on the second major surface to cover at least a part of a side surface of the light emitting layer and to seal a side face of the first metal post and a side face of the second metal post, the sealing layer being light-shielding with respect to the first light;
   forming a bonding layer on the first major surface, the bonding layer being transparent to the first light, at least a part of a side face of the bonding layer being not covered by the sealing layer; and
   forming a fluorescent layer on the bonding layer, the fluorescent layer being configured to absorb a part of the first light and to emit a second light having a wavelength different from a wavelength of the first light, at least the part of the side face of the bonding layer being not covered by the fluorescent layer; and
   performing singulation for each of sets of each of the first electrodes and each of the second electrodes.

38. The method according to claim 37, further comprising forming a transparent layer between the bonding layer and the fluorescent layer, the transparent layer being transparent to light emitted from the light emitting layer.

* * * * *